(12) United States Patent
Fujii

(10) Patent No.: US 12,021,511 B2
(45) Date of Patent: Jun. 25, 2024

(54) DRIVE CIRCUIT OF SWITCHING ELEMENT AND INTELLIGENT POWER MODULE

(71) Applicant: FUJI ELECTRIC CO., LTD., Kawasaki (JP)

(72) Inventor: Masanari Fujii, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 18/160,358

(22) Filed: Jan. 27, 2023

(65) Prior Publication Data

US 2023/0299764 A1    Sep. 21, 2023

(30) Foreign Application Priority Data

Mar. 17, 2022  (JP) ................. 2022-042507

(51) Int. Cl.
  *H03K 17/082* (2006.01)
  *H02M 1/08* (2006.01)
  *H03K 17/567* (2006.01)

(52) U.S. Cl.
  CPC ............ *H03K 17/082* (2013.01); *H02M 1/08* (2013.01); *H03K 17/567* (2013.01)

(58) Field of Classification Search
  CPC .................................................. H03K 17/082
  USPC ................................................ 327/365, 109
  See application file for complete search history.

(56) References Cited

U.S. PATENT DOCUMENTS 9,246,474 B2*  1/2016  Takagiwa .............. H03K 3/012
2013/0147525 A1  6/2013  Takagiwa

FOREIGN PATENT DOCUMENTS

JP      2020005085 A    1/2020
WO      2012153459 A1   11/2012

* cited by examiner

*Primary Examiner* — Tomi Skibinski

(57) ABSTRACT

There is provided a drive circuit of a switching element and an intelligent power module both capable of preventing deterioration of a switching loss of the switching element. A gate drive circuit includes a first current supply section which supplies a first current to a gate terminal provided in an IGBT when a gate voltage of the gate terminal is lower than a first voltage, a second current supply section which supplies a second current smaller than the first current to the gate terminal when the gate voltage of the gate terminal is higher than a second voltage which is the same as or higher than the first voltage, and a third current supply section which supplies a third current smaller than the first current and larger than the second current to the gate terminal when the gate voltage of the gate terminal is lower than a third voltage lower than the first voltage.

16 Claims, 8 Drawing Sheets

DRIVE CIRCUIT OF SWITCHING ELEMENT AND INTELLIGENT POWER MODULE

CROSS-REFERENCE TO RELATED APPLICATIONS

This application is based upon and claims the benefit of priority from the prior Japanese Patent Application No. 2022-042507, filed on Mar. 17, 2022, the entire contents of which are incorporated herein by reference.

TECHNICAL FIELD

The present invention relates to a drive circuit of a switching element and an intelligent power module both applied to a power conversion apparatus and the like.

BACKGROUND ART

Conventionally, an insulated gate bipolar transistor (IGBT) is turned on by driving its gate with a constant current. When a gate voltage of the IGBT rises close to a power supply voltage, a low current consumption mode is entered and the driving of the IGBT is continued.

PTL 1 discloses a drive circuit of an insulated gate switching element, which suppresses current consumption by shifting to a low current consumption mode when a gate voltage reaches a predetermined voltage at which a turn-on state is reached. PTL 2 discloses a drive circuit of a voltage-driven switching element, which can optimally reduce current consumption when driving the switching element with a constant current and constant voltage.

CITATION LIST

Patent Literatures

PTL 1: WO 2012/153459
PTL 2: JP 2020-5085 A

SUMMARY OF INVENTION

Technical Problem

A current flows through the IGBT when the IGBT is turned on. Wiring for connecting with other components is connected to the IGBT. When the current flowing through the IGBT at its turn-on flows through the wiring, a voltage is generated by the inductor component of the wiring. The generated voltage raises the gate voltage due to a parasitic capacitance generated in the IGBT. Therefore, the mode may be switched to a low current consumption mode even though it is essentially the period for charging the gate of the IGBT. A problem arises in that when such unexpected switching to the low current consumption mode occurs, a mirror region period at the turn-on of the IGBT becomes longer, and a switching time increases, thus resulting in deterioration of a switching loss. As the product ratings of IGBTs and other switching elements increase, the problem of deteriorating the switching loss becomes more pronounced.

An object of the present invention is to provide a drive circuit of a switching element and an intelligent power module both capable of preventing deterioration of a switching loss of the switching element.

Solution to Problem

In order to achieve the above object, a drive circuit of a switching element according to one aspect of the present invention includes a first current supply section which supplies a first current to a control signal input terminal provided in the switching element when a voltage of the control signal input terminal is lower than a first voltage, a second current supply section which supplies a second current smaller than the first current to the control signal input terminal when the voltage of the control signal input terminal is higher than a second voltage which is the same as or higher than the first voltage, and a third current supply section which supplies a third current smaller than the first current and larger than the second current to the control signal input terminal when the voltage of the control signal input terminal is lower than a third voltage lower than the first voltage.

Further, in order to achieve the above object, an intelligent power module according to one aspect of the present invention includes a plurality of semiconductor devices each of which includes a semiconductor element having a switching element and a diode connected in antiparallel to the switching element, and the drive circuit of the switching element according to the one aspect of the present invention.

Advantageous Effects of Invention

According to one aspect of the present invention, it is possible to prevent deterioration of a switching loss of a switching element.

DESCRIPTION OF EMBODIMENTS

Each embodiment of the present invention exemplifies a device and method for embodying the technical idea of the present invention. The technical idea of the present invention is not specified to the material, shape, structure, arrangement, etc. of component parts described below. Various modifications can be made to the technical idea of the present invention within the technical scope defined by the claims.

First Embodiment

<Intelligent Power Module>

Figure 1:
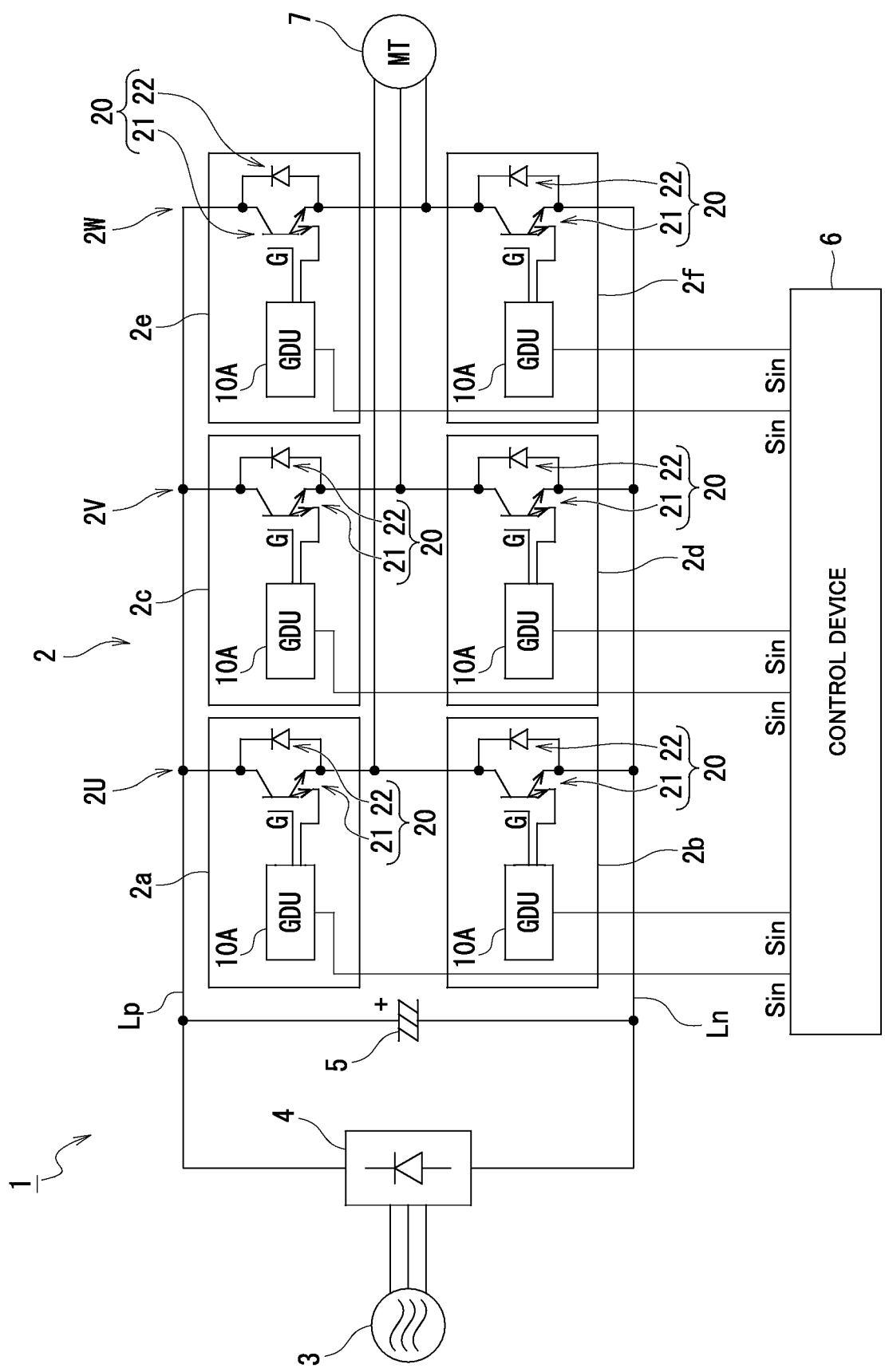
FIG. 1 is a diagram illustrating an example of a schematic configuration of a power conversion apparatus including an intelligent power module according to a first embodiment of the present invention.

A drive circuit of a switching element and an intelligent power module according to a first embodiment of the present invention will be described with reference to FIGS. 1 through 4. First, the intelligent power module 2 according to this embodiment will be described with reference to FIG. 1. FIG. 1 is a diagram illustrating an example of a schematic configuration of a power conversion apparatus 1 including the intelligent power module 2 according to this embodiment. An inverter circuit will be described below as an example of the intelligent power module 2 according to this embodiment, but the intelligent power module 2 is not limited to the inverter circuit, and can also be applied to a power conversion apparatus such as a converter circuit, a full bridge circuit, or the like.

As illustrated in FIG. 1, the power conversion apparatus 1 is connected to a three-phase AC power supply 3. The power conversion apparatus 1 includes a rectifier circuit 4 which performs full-wave rectification of three-phase AC power input from the three-phase AC power supply 3, and a smoothing capacitor 5 which smoothes the power rectified by the rectifier circuit 4. Although illustration of a specific configuration of the rectifier circuit 4 is omitted, it is configured by connecting six diodes in a full bridge or by connecting six switching elements in a full bridge.

A positive side line Lp is connected to a positive output terminal of the rectifier circuit 4, and a negative side line Ln is connected to a negative output terminal of the rectifier circuit 4. The smoothing capacitor 5 is connected between the positive side line Lp and the negative side line Ln. Further, the power conversion apparatus 1 includes the intelligent power module 2 which functions as an inverter circuit converting a DC voltage applied between the positive side line Lp and the negative side line Ln into a three-phase AC voltage. The intelligent power module 2 includes semiconductor devices 2a, 2c, and 2e each having an insulated gate bipolar transistor (an example of a switching element) 21 as, for example, a switching element constituting an upper arm portion connected to the positive side line Lp, and semiconductor devices 2b, 2d, and 2f each having an insulated gate bipolar transistor 21 constituting a lower arm portion connected to the negative side line Ln. Hereinafter, the insulated gate bipolar transistor is abbreviated as an "IGBT".

The IGBT 21 included in the semiconductor device 2a and the IGBT 21 included in the semiconductor device 2b are connected in series between the positive side line Lp and the negative side line Ln to configure a U-phase output arm 2U. The IGBT 21 included in the semiconductor device 2c and the IGBT 21 included in the semiconductor device 2d are connected in series between the positive side line Lp and the negative side line Ln to configure a V-phase output arm 2V. The IGBT 21 included in the semiconductor device 2e and the IGBT 21 included in the semiconductor device 2f are connected in series between the positive side line Lp and the negative side line Ln to configure a W-phase output arm 2W.

A freewheel diode 22 is connected in antiparallel to each of the IGBTs 21 included in the semiconductor devices 2a, 2b, 2c, 2d, 2e, and 2f (hereinafter, "the semiconductor devices 2a, 2b, 2c, 2d, 2e, and 2f" may be abbreviated as "semiconductor devices 2a to 2f"). The details of the IGBT 21 and the freewheel diode 22 will be described later.

A connecting portion between the IGBT 21 included in the semiconductor device 2a and the IGBT 21 included in the semiconductor device 2b, a connecting portion between the IGBT 21 included in the semiconductor device 2c and the IGBT 21 included in the semiconductor device 2d, and a connecting portion between the IGBT 21 included in the semiconductor device 2e and the IGBT 21 included in the semiconductor device 2f are connected to, for example, a motor 7 as a load respectively.

The semiconductor devices 2a to 2f respectively include gate drive circuits (an example of drive circuits of switching elements) 10A which individually control the switching operations of the IGBTs 21. In FIG. 1, the gate drive circuit 10A is denoted as "GDU". In each of the semiconductor devices 2a to 2f, output terminals of the gate drive circuits 10A are respectively connected to gate terminals (an example of control signal input terminals) G of the IGBTs 21.

The intelligent power module 2 has a three-phase full bridge circuit in which the U-phase output arm 2U, the V-phase output arm 2V, and the W-phase output arm 2W are connected in parallel, the semiconductor devices 2a and 2b which control the switching operation of the U-phase output arm 2U, the semiconductor devices 2c and 2d which control the switching operation of the V-phase output arm 2V, and the semiconductor devices 2e and 2f which control the switching operation of the W-phase output arm 2W.

The power conversion apparatus 1 has a control device 6 which controls the gate drive circuits 10A respectively provided in the semiconductor devices 2a to 2f. The control device 6 is configured to individually output, for example, a pulse-shaped input signal Sin to each of the gate drive circuits 10A respectively included in the semiconductor devices 2a to 2f. Thus, the control device 6 controls the gate drive circuits 10A respectively included in the semiconductor devices 2a to 2f to drive the IGBTs 21 respectively included in the semiconductor devices 2a to 2f by Pulse Width Modulation (PWM), for example.

The gate drive circuit 10A corresponds to an example of a drive circuit of a switching element according to this embodiment. Therefore, the intelligent power module 2 includes a plurality of semiconductor devices (six semiconductor devices 2a to 2f in this embodiment) each having a semiconductor element 20 having the IGBT 21 and the freewheel diode (an example of a diode) 22 connected in antiparallel to the IGBT 21, and the gate drive circuit 10A according to this embodiment.

<Drive Circuit of Switching Element>

Figure 2:
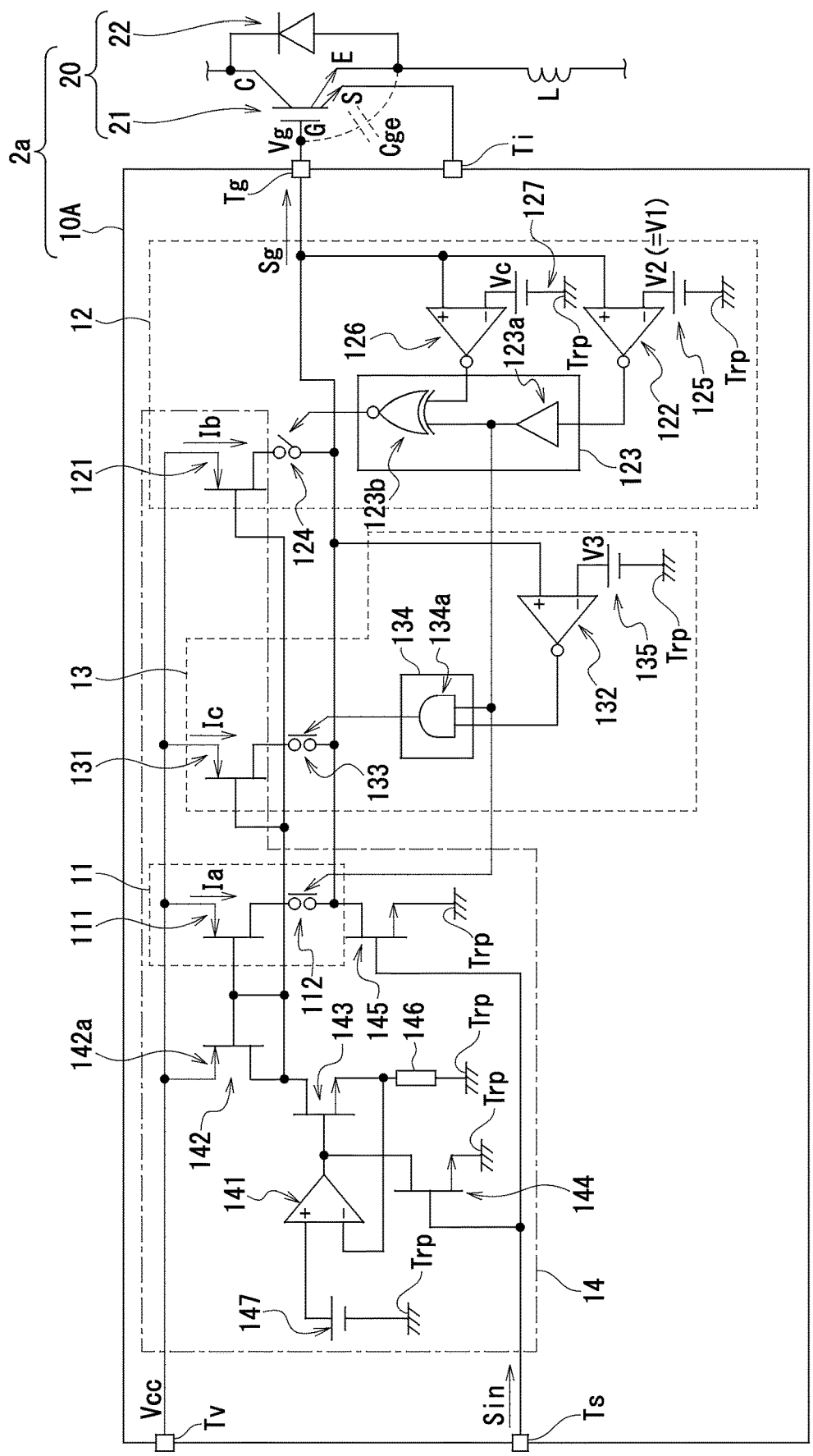
FIG. 2 is a circuit diagram illustrating an example of a schematic configuration of a gate drive circuit as a drive circuit of a switching element according to the first embodiment of the present invention.

Next, the gate drive circuit 10A as the drive circuit of the switching element according to this embodiment will be described using FIGS. 2 to 4 while referring to FIG. 1. The gate drive circuits 10A respectively provided in the semiconductor devices 2a to 2f have the same configuration and operate in the same manner. Therefore, the gate drive circuit 10A will be described below by taking for example, the gate drive circuit 10A provided in the semiconductor device 2a. FIG. 2 is a circuit diagram illustrating an example of a schematic configuration of the gate drive circuit 10A.

<Configuration of Drive Circuit of Switching Element>

As illustrated in FIG. 2, the gate drive circuit 10A includes a gate signal generating section 14 which generates a gate signal (an example of a control signal) Sg to control the IGBT 21 by using the input signal Sin input from the control device 6 (refer to FIG. 1). Also, the gate drive circuit 10A includes a first current supply section 11 which supplies a first current Ia to the gate terminal G when a gate voltage (an example of a voltage) Vg of the gate terminal G (an example of the control signal input terminal) provided in the IGBT (an example of the switching element) 21 is lower than a first voltage V1. Further, the gate drive circuit 10A includes a second current supply section 12 which supplies a second current Ib smaller than the first current Ia to the gate terminal G when the gate voltage Vg of the gate terminal G is higher than a second voltage V2 which is the same as or higher than the first voltage V1. In this embodiment, the first voltage V1 and the second voltage V2 are set to the same voltage value. In addition, the gate drive circuit 10A includes a third current supply section 13 which supplies a third current Ic smaller than the first current Ia and larger than the second current Ib to the gate terminal G when the gate voltage Vg of the gate terminal G is lower than a third voltage V3 lower than the first voltage V1. When the absolute maximum standard of the IGBT 21 is 600 V and 400 A, for example, the first current Ia is set to 200 mA, for example, the second current Ib is set to 15 mA, for example, and the third current Ic is set to 100 mA, for example.

As illustrated in FIG. 2, the gate signal generating section 14 has a voltage generating part 147. The voltage generating part 147 is configured by a DC power supply, for example. A negative side of the voltage generating part 147 is connected to a reference potential terminal Trp supplied with a reference potential of the gate drive circuit 10A. The gate signal generating section 14 has an amplifier 141 to which a voltage generated by the voltage generating part 147 is input. The gate signal generating section 14 has a MOS transistor 143 whose gate terminal is input with an output signal output from the amplifier 141. The amplifier 141 is comprised of an operational amplifier, for example. The MOS transistor 143 is an N-type MOS transistor, for example. An output terminal of the amplifier 141 is connected to the gate terminal of the MOS transistor 143. A non-inversion input terminal (+) of the amplifier 141 is connected to a positive side of the voltage generating part 147.

The gate signal generating section 14 has a current mirror circuit 142 connected to a drain terminal of the MOS transistor 143, and a resistance element 146 connected to a source terminal of the MOS transistor 143. One terminal of the resistance element 146 is connected to the source terminal of the MOS transistor 143, and the other terminal of the resistance element 146 is connected to the reference potential terminal Trp. A connecting portion between the source terminal of the MOS transistor 143 and one terminal of the resistance element 146 is connected to an inversion input terminal (−) of the amplifier 141.

The current mirror circuit 142 has a MOS transistor 142a, a MOS transistor 111, a MOS transistor 121, and a MOS transistor 131 whose gate terminals are connected to each other. Although the details will be described later, the MOS transistor 111 serves as a current supply element provided in the first current supply section 11 to supply the first current Ia to the gate terminal G. The MOS transistor 121 serves as a current supply element provided in the second current supply section 12 to supply the second current Ib to a gate terminal G. The MOS transistor 131 serves as a current supply element provided in the third current supply section 13 to supply the third current Ic to the gate terminal G. Each of the MOS transistor 142a, the MOS transistor 121, and the MOS transistor 131 is comprised of a P-type MOS transistor, for example. A source terminal of the MOS transistor 142a is connected to a power supply input terminal Tv input with a power supply voltage Vcc. A drain terminal of the MOS transistor 142a is connected to the gate terminals of the MOS transistors 142a, 111, 121, and 131, and the drain terminal of the MOS transistor 143.

The gate signal generating section 14 has a MOS transistor 144 whose gate terminal is connected to the control device 6. The MOS transistor 144 is an N-type MOS transistor, for example. The input signal Sin output from the control device 6 is input to a gate terminal of the MOS transistor 144. Consequently, the on/off state (conducting/non-conducting state) of the MOS transistor 144 is controlled by the control device 6. When the voltage level of the input signal Sin is at a high level, the MOS transistor 144 becomes the on state (conducting state), and when the voltage level of the input signal Sin is at a low level, the MOS transistor 144 becomes the off state (non-conducting state).

A source terminal of the MOS transistor 144 is connected to the reference potential terminal Trp. A drain terminal of the MOS transistor 144 is connected to the output terminal of the amplifier 141 and the gate terminal of the MOS transistor 143.

The amplifier 141, the MOS transistor 143, and the resistance element 146 constitute a constant current circuit. The amplifier 141 outputs to the gate terminal of the MOS transistor 143, an output signal having a voltage level at which the value of a voltage drop across the resistance element 146 becomes equal to the voltage generated by the voltage generating part 147. Consequently, a predetermined constant current flows through the MOS transistor 142a provided in the current mirror circuit 142. Also, the current mirror circuit 142 outputs the first current Ia of, for example, the same amount of current as the constant current from the MOS transistor 111 to the gate terminal G of the IGBT 21 as a gate current. Further, the current mirror circuit 142 outputs the second current Ib of, for example, a smaller amount of current than the constant current from the MOS transistor 121 to the gate terminal G of the IGBT 21 as a gate current. In addition, the current mirror circuit 142 outputs the third current Ic having an amount of current which is, for example, smaller than the constant current and greater than the second current Ib from the MOS transistor 131 to the gate terminal G of the IGBT 21 as a gate current. Thus, the MOS transistors 111, 121, and 131 provided in the current mirror circuit 142 function as charging switches for charging the gate terminal G of the IGBT 21.

On the other hand, since the gate of the MOS transistor 143 is electrically connected to the reference potential terminal Trp through the MOS transistor 144 when the MOS transistor 144 is in the on state, the MOS transistor 143 becomes an off state. Thus, since the current mirror circuit 142 is not capable of making a current flow from the MOS transistor 142a to the MOS transistor 143 and the resistance element 146, it is not possible to make the gate current flow from the MOS transistors 111, 121, and 131 to the gate terminal G of the IGBT 21.

The gate signal generating section 14 has a MOS transistor 145 arranged between the current mirror circuit 142 and the reference potential terminal Trp. A drain terminal of the MOS transistor 145 is connected to other terminals of the switches 112, 124, and 133 (details will be described later). A source terminal of the MOS transistor 145 is connected to the reference potential terminal Trp. A gate terminal of the MOS transistor 145 is connected to a signal input terminal Ts to which the input signal Sin is input. Therefore, the gate terminal of the MOS transistor 145 is input with the input signal Sin output from the control device 6. Thus, the on/off state (conducting/non-conducting state) of the MOS transistor 145 is controlled in sync with the MOS transistor 144. When the voltage level of the input signal Sin is at a high level, the MOS transistor 145 is turned on (conducting state) to electrically connect the gate terminal G of the IGBT 21 to the reference potential terminal Trp. On the other hand, when the voltage level of the input signal Sin is at a low level, the MOS transistor 145 is turned off (non-conducting state) to electrically disconnect the gate terminal G of the IGBT 21 from the reference potential terminal Trp. In this manner, the MOS transistor 145 functions as a discharging switch for discharging the charge charged on the gate terminal G of the IGBT 21 to the reference potential terminal Trp.

As illustrated in FIG. 2, the second current supply section 12 has a comparator 122 (an example of a second comparing part) which compares the voltage based on the gate voltage Vg of the gate terminal G with the second voltage V2. In this embodiment, the voltage based on the gate voltage Vg is the gate voltage Vg itself. Therefore, details will be described later, but in the gate drive circuit 10A, the gate voltage Vg is input to the comparator 122. The second current supply section 12 has a switch 124 (a second changeover switch) which switches between a disconnected state of the second current supply section 12 from the gate terminal G and a connected state of the second current supply section 12 to the gate terminal G, based on the signal level of an output signal output from the comparator 122.

The second current supply section 12 has a MOS transistor 121 constituting the current mirror circuit 142, a logic circuit unit 123 arranged between the comparator 122 and the switch 124, and a voltage generating part 125 which generates the second voltage V2. The logic circuit unit 123 has a buffer circuit 123a and an exclusive NOR (hereinafter abbreviated as "XNOR") circuit 123b. Further, the second current supply section 12 has a comparator 126 and a voltage generating part 127 used to detect the upper limit of the gate voltage Vg when charging the gate terminal G of the IGBT 21.

The voltage generating part 125 is configured by a DC power supply, for example. A negative side of the voltage generating part 125 is connected to the reference potential terminal Trp. The voltage generating part 125 is adapted to generate the second voltage V2. The second voltage V2 is set to a voltage at which it can be assumed that charging of the gate terminal G of the IGBT 21 is completed, that is, turn-on of the IGBT 21 is ended. That is, the second voltage V2 is set to a voltage value of the gate voltage Vg which allows the IGBT 21 to supply the motor 7 with the minimum current required to operate the motor 7 (refer to FIG. 1). When the power supply voltage applied to the IGBT 21 is 20 V, for example, the second voltage V2 is set to 13V, for example.

The comparator 122 is, for example, a hysteresis comparator comprised of an operational amplifier and an unillustrated resistance element. A gate voltage output terminal Tg provided in the gate drive circuit 10A is connected to a non-inversion input terminal (+) of the comparator 122. The gate terminal G of the IGBT 21 is connected to the gate voltage output terminal Tg. Therefore, the non-inversion input terminal (+) of the comparator 122 is connected to the gate terminal G of the IGBT 21 via the gate voltage output terminal Tg. The positive side of the voltage generating part 125 is connected to an inversion input terminal (−) of the comparator 122. A NOT output terminal of the comparator 122 is connected to an input terminal of the buffer circuit 123a provided in the logic circuit unit 123.

The comparator 122 outputs an output signal whose signal level (i.e., voltage level) is at a high level when the gate voltage Vg of the gate terminal G of the IGBT 21 (hereinafter may be referred to as "the gate voltage Vg applied to the gate terminal G of the IGBT 21") is lower than the second voltage V2 generated by the voltage generating part 125. Further, the comparator 122 outputs an output signal whose signal level is at a low level when the gate voltage Vg is higher than the second voltage V2.

An output terminal of the buffer circuit 123a is connected to one input terminal of the XNOR circuit 123b provided in the logic circuit unit 123. The buffer circuit 123a is provided to correct the signal level (voltage level) of the signal input from the comparator 122. The switches 112, 124, and 133 (details will be described later) and the like are connected to the output terminal side of the comparator 122. Therefore, when the buffer circuit 123a is not provided, there is a possibility that the signal level (voltage level) of the output signal of the comparator 122 is lowered due to the element and wiring load, causing the switches 112, 124, and 133 to malfunction. Therefore, the gate drive circuit 10A is provided with the buffer circuit 123a to which the output signal of the comparator 122 is input, so that the switches 112, 124, and 133 are controlled by signals having the same signal level as the output signal output from the comparator 122.

The voltage generating part 127 is configured by a DC power supply, for example. A negative side of the voltage generating part 127 is connected to the reference potential terminal Trp. The voltage generating part 127 is adapted to generate a comparison voltage Vc. The comparison voltage Vc is set to a value higher than the second voltage V2 and lower than the power supply voltage applied to the IGBT 21. The comparison voltage Vc is set to a value closer to the power supply voltage than the second voltage V2. When the power supply voltage applied to the IGBT 21 is 20 V, for example, the comparison voltage Vc is set to 19V, for example.

The comparator 126 is, for example, a hysteresis comparator comprised of an operational amplifier and an unillustrated resistance element. A non-inversion input terminal (+) of the comparator 126 is connected to the gate voltage output terminal Tg provided in the gate drive circuit 10A. Therefore, the non-inversion input terminal (+) of the comparator 126 is connected to the gate terminal G of the IGBT 21 via the gate voltage output terminal Tg. A positive side of the voltage generating part 127 is connected to an inversion input terminal (−) of the comparator 126. A NOT output terminal of the comparator 126 is connected to the XNOR circuit 123b provided in the logic circuit unit 123.

The comparator 126 outputs an output signal whose signal level (i.e., voltage level) is at a high level when the gate voltage Vg of the gate terminal G of the IGBT 21 is lower than the comparison voltage Vc generated by the voltage generating part 127. Further, the comparator 126 outputs an output signal whose signal level is at a low level when the gate voltage Vg is higher than the comparison voltage Vc.

One input terminal of the XNOR circuit 123b is connected to the output terminal of the buffer circuit 123a provided in the logic circuit unit 123. The other input terminal of the XNOR circuit 123b is connected to the NOT output terminal of the comparator 126. A NOT output terminal of the XNOR circuit 123b is connected to a control signal input terminal of the switch 124.

When the gate voltage Vg of the gate terminal G of the IGBT 21 is lower than both the second voltage V2 and the comparison voltage Vc, the comparators 122 and 126 output output signals whose signal levels are at a high level to the XNOR circuit 123*b*. In this case, the XNOR circuit 123*b* outputs to the switch 124, an operation signal whose signal level is at a high level. Also, when the gate voltage Vg of the gate terminal G of the IGBT 21 is higher than the second voltage V2 and lower than the comparison voltage Vc, the comparator 122 outputs an output signal whose signal level is at a low level to the XNOR circuit 123*b*, and the comparator 126 outputs an output signal whose signal level is at a high level to the XNOR circuit 123*b*. In this case, the XNOR circuit 123*b* outputs to the switch 124, an operation signal whose signal level is at a low level. Further, when the gate voltage Vg of the gate terminal G of the IGBT 21 is higher than both the second voltage V2 and the comparison voltage Vc, each of the comparators 122 and 126 outputs an output signal whose signal level is at a low level to the XNOR circuit 123*b*. In this case, the XNOR circuit 123*b* outputs an operation signal whose signal level is at a high level to the switch 124.

The switch 124 is comprised of a P-type MOS transistor, for example. One terminal (e.g., a source terminal) of the switch 124 is connected to a drain terminal of the MOS transistor 121. The other terminal (for example, a drain terminal) of the switch 124 is connected to the gate voltage output terminal Tg. Therefore, the other terminal of the switch 124 is connected to the gate terminal G of the IGBT 21 via the gate voltage output terminal Tg. The control signal input terminal (for example, a gate terminal) of the switch 124 is connected to the NOT output terminal of the XNOR circuit 123*b*. For this reason, the switch 124 is controlled to be opened/closed by an operation signal logically operated in the XNOR circuit 123*b*.

As described above, when the gate voltage Vg of the gate terminal G of the IGBT 21 is lower than both the second voltage V2 and the comparison voltage Vc, and when the gate voltage Vg of the gate terminal G of the IGBT 21 is higher than both the second voltage V2 and the comparison voltage Vc, the XNOR circuit 123*b* outputs an operation signal whose signal level is at a high level to the control signal input terminal of the switch 124. On the other hand, when the gate voltage Vg of the gate terminal G of the IGBT 21 is higher than the second voltage V2 and lower than the comparison voltage Vc, the XNOR circuit 123*b* outputs an operation signal whose signal level is at a low level to the control signal input terminal of the switch 124.

Therefore, when the gate voltage Vg of the gate terminal G of the IGBT 21 is lower than both the second voltage V2 and the comparison voltage Vc, and when the gate voltage Vg of the gate terminal G of the IGBT 21 is higher than both the second voltage V2 and the comparison voltage Vc, the switch 124 brings the second current supply section 12 into a state of being disconnected (i.e., cut off) from the gate terminal G of the IGBT 21. On the other hand, when the gate voltage Vg of the gate terminal G of the IGBT 21 is higher than the second voltage V2 and lower than the comparison voltage Vc, the switch 124 is brought into an on state (conducting state), so that the switch 124 brings the second current supply section 12 into a connected state to the gate terminal G of the IGBT 21.

Thus, the switch 124 can switch between the disconnected state of the second current supply section 12 from the gate terminal G of the IGBT 21 and the connected state of the second current supply section 12 to the gate terminal G of the IGBT 21, based on the magnitudes of the gate voltage Vg and the second voltage V2 (that is, the signal level of the output signal output from the comparator 122). Here, the disconnected state of the second current supply section 12 from the gate terminal G of the IGBT 21 refers to a state in which the MOS transistor 121 serving as the current supply element of the second current supply section 12 is electrically disconnected (cut off) from the gate terminal G of the IGBT 21 by the switch 124. Further, the connected state of the second current supply section 12 to the gate terminal G of the IGBT 21 refers to a state in which the MOS transistor 121 serving as the current supply element of the second current supply section 12 is electrically connected to the gate terminal G of the IGBT 21 by the switch 124.

Therefore, when the switch 124 is in the state of connecting the second current supply section 12 to the gate terminal G of the IGBT 21, the second current supply section 12 can supply the second current Ib from the MOS transistor 121 to the gate terminal G of the IGBT 21. On the other hand, when the switch 124 is in the state of disconnecting the second current supply section 12 from the gate terminal G of the IGBT 21, the second current supply section 12 can cut off the supply of the second current Ib from the MOS transistor 121 to the gate terminal G of the IGBT 21.

The first current supply section 11 has the switch 112 (an example of a first changeover switch) which switches between a disconnected state of the first current supply section 11 from the gate terminal G of the IGBT 21 and a connected state of the first current supply section 11 to the gate terminal G of the IGBT 21, based on the signal level of the output signal output from the comparator 122. Also, the first current supply section 11 has the MOS transistor 111 which constitutes the current mirror circuit 142.

The switch 112 is comprised of an N-type MOS transistor, for example. One terminal (for example, a drain terminal) of the switch 112 is connected to a drain terminal of the MOS transistor 111. The other terminal (for example, a source terminal) of the switch 112 is connected to the gate voltage output terminal Tg. Therefore, the other terminal of the switch 112 is connected to the gate terminal G of the IGBT 21 via the gate voltage output terminal Tg. Further, the other terminal of the switch 112 is connected to the drain terminal of the MOS transistor 145. A control signal input terminal (for example, a gate terminal) of the switch 112 is connected to the output terminal of the buffer circuit 123*a* provided in the logic circuit unit 123 of the second current supply section 12. Therefore, the switch 112 is controlled to open or close by the output signal output from the buffer circuit 123*a*.

The buffer circuit 123*a* outputs a signal of the same signal level as that of the comparator 122. Further, in this embodiment, the first voltage V1 and the second voltage V2 are set to the same voltage value. Therefore, when the gate voltage Vg of the gate terminal G of the IGBT 21 is lower than the second voltage V2 (that is, when it is lower than the first voltage V1), an output signal which is output from the buffer circuit 123*a* and is the same high level as the output signal of the comparator 122 is input to the control signal input terminal of the switch 112. Consequently, the switch 112 is controlled to be in an on state (conducting state), so that the first current supply section 11 is brought into a state of being connected to the gate terminal G of the IGBT 21.

On the other hand, when the gate voltage Vg of the gate terminal G of the IGBT 21 is higher than the second voltage V2 (that is, when it is higher than the first voltage V1), an output signal which is output from the buffer circuit 123*a* and is the same low level as the output signal of the comparator 122 is input to the control signal input terminal of the switch 112. Consequently, since the switch 112 is controlled to be in an off state (non-conducting state), the first current supply section 11 is brought into a state of being disconnected (cut off) from the gate terminal G of the IGBT 21.

Thus, the switch 112 can switch between the disconnected state of the first current supply section 11 from the gate terminal G of the IGBT 21 and the connected state of the first current supply section 11 to the gate terminal G of the IGBT 21, based on the magnitudes of the gate voltage Vg and the second voltage V2 (that is, the signal level of the output signal output from the comparator 122). Here, the disconnected state of the first current supply section 11 from the gate terminal G of the IGBT 21 refers to a state in which the MOS transistor 111 serving as the current supply element of the first current supply section 11 is electrically disconnected (cut off) from the gate terminal G of the IGBT 21 by the switch 112. Further, the connected state of the first current supply section 11 to the gate terminal G of the IGBT 21 refers to a state in which the MOS transistor 111 serving as the current supply element of the first current supply section 11 is electrically connected to the gate terminal G of the IGBT 21 by the switch 112.

Therefore, when the switch 112 is in the state of connecting the first current supply section 11 to the gate terminal G of the IGBT 21, the first current supply section 11 can supply the first current Ia from the MOS transistor 111 to the gate terminal G of the IGBT 21. On the other hand, when the switch 112 is in the state of disconnecting the first current supply section 11 from the gate terminal G of the IGBT 21, the first current supply section 11 can cut off the supply of the first current Ia from the MOS transistor 111 to the gate terminal G of the IGBT 21.

As illustrated in FIG. 2, the third current supply section 13 has a comparator 132 (an example of a third comparing part) which compares the voltage based on the gate voltage Vg of the gate terminal G of the IGBT 21 (the gate voltage Vg itself in this embodiment) with the third voltage V3. The third current supply section 13 has the switch 133 (an example of a third changeover switch) which switches between a disconnected state of the third current supply section 13 from the gate terminal G of the IGBT 21 and a connected state of the third current supply section 13 to the gate terminal G of the IGBT 21, based on the signal level of the output signal output from the comparator 122 and the signal level of an output signal output from the comparator 132.

The third current supply section 13 has the MOS transistor 131 constituting the current mirror circuit 142, a logic circuit unit 134 arranged between the comparator 132 and the switch 133, and a voltage generating part 135 which generates the third voltage V3. The logic circuit unit 134 has a logical product (hereinafter abbreviated as "AND") circuit 134a.

The voltage generating part 135 is configured by a DC power supply, for example. The negative side of the voltage generating part 135 is connected to the reference potential terminal Trp. The voltage generating part 135 is adapted to generate the third voltage V3. The third voltage V3 is set to a voltage which is greater than or equal to the voltage at which the current begins to flow through the IGBT 21 (that is, the voltage which initiates turn-on) and lower than the second voltage V2. Further, as the voltage lower than the second voltage V2, the third voltage V3 is set to a voltage value which becomes a gate current (current supplied to the gate terminal G) which does not allow the gate voltage Vg having overshoot when the IGBT 21 turns on to exceed the voltage at which turn-on ends (that is, the second voltage V2). The third voltage V3 is determined by IGBT operation tests and operation simulations, etc., for example. When the power supply voltage applied to the IGBT 21 is 20V, for example, the third voltage V3 is set to 8V, for example.

The comparator 132 is, for example, a hysteresis comparator comprised of an operational amplifier and an unillustrated resistance element. A non-inversion input terminal (+) of the comparator 132 is connected to the gate voltage output terminal Tg provided in the gate drive circuit 10A. Therefore, the non-inversion input terminal (+) of the comparator 132 is connected to the gate terminal G of the IGBT 21 via the gate voltage output terminal Tg. The positive side of the voltage generating part 135 is connected to an inversion input terminal (−) of the comparator 132. A NOT output terminal of the comparator 132 is connected to one input terminal of the AND circuit 134a provided in the logic circuit unit 134.

When the gate voltage Vg of the gate terminal G of the IGBT 21 is lower than the third voltage V3 generated by the voltage generating part 135, the comparator 132 outputs an output signal whose signal level (that is, voltage level) is at a high level. Further, the comparator 132 outputs an output signal whose signal level is at a low level when the gate voltage Vg is higher than the third voltage V3.

The other input terminal of the AND circuit 134a provided in the logic circuit unit 134 is connected to the output terminal of the buffer circuit 123a provided in the logic circuit unit 123 of the second current supply section 12. An output terminal of the AND circuit 134a is connected to a control signal input terminal of the switch 133.

The switch 133 is comprised of an N-type MOS transistor, for example. One terminal (for example, a drain terminal) of the switch 133 is connected to a drain terminal of the MOS transistor 131. The other terminal (for example, a source terminal) of the switch 133 is connected to the gate voltage output terminal Tg. Therefore, the other terminal of the switch 133 is connected to the gate terminal G of the IGBT 21 via the gate voltage output terminal Tg. The control signal input terminal (for example, a gate terminal) of the switch 133 is connected to the output terminal of the AND circuit 134a. For this reason, the switch 133 is controlled to be opened or closed by an operation signal logically operated in the AND circuit 134a.

When the gate voltage Vg of the gate terminal G of the IGBT 21 is lower than the second voltage V2 and the third voltage V3, both the comparators 122 and 132 output output signals whose signal levels are at a high level. Therefore, the AND circuit 134a outputs an operation signal whose signal level is at a high level to the control signal input terminal of the switch 133. Therefore, when the gate voltage Vg of the gate terminal G of the IGBT 21 is lower than the second voltage V2 and the third voltage V3, the AND circuit 134a outputs an operation signal whose signal level is at a high level to the control signal input terminal of the switch 133. Thus, since the switch 133 is controlled to be in an on state (conducting state), the switch 133 brings the third current supply section 13 into a state of being connected to the gate terminal G of the IGBT 21.

On the other hand, when the gate voltage Vg of the gate terminal G of the IGBT 21 is lower than the second voltage V2 and higher than the third voltage V3, the comparator 122 outputs an output signal whose signal level is at a high level, and the comparator 132 outputs an output signal whose signal level is at a low level. Therefore, when the gate voltage Vg of the gate terminal G of the IGBT 21 is lower than the second voltage V2 and higher than the third voltage V3, the AND circuit 134a outputs an operation signal whose signal level is at a low level to the control signal input terminal of the switch 133. Thus, since the switch 133 is controlled to be in an off state (non-conducting state), the switch 133 brings the third current supply section 13 into a state (i.e., a cut off state) of being disconnected from the gate terminal G of the IGBT 21.

Thus, the switch 133 can switch between the disconnected state of the third current supply section 13 from the gate terminal G of the IGBT 21 and the connected state of the third current supply section 13 to the gate terminal G of the IGBT 21, based on the magnitudes of the gate voltage Vg and the second voltage V2 and the third voltage V3 (that is, the signal level of the output signal output from each of the comparators 122 and 132). Here, the disconnected state of the third current supply section 13 from the gate terminal G of the IGBT 21 refers to a state in which the MOS transistor 131 serving as the current supply element of the third current supply section 13 is electrically disconnected (cut off) from the gate terminal G of the IGBT 21 by the switch 133. Further, the connected state of the third current supply section 13 to the gate terminal G of the IGBT 21 refers to a state in which the MOS transistor 131 serving as the current supply element of the third current supply section 13 is electrically connected to the gate terminal G of the IGBT 21 by the switch 133.

Therefore, when the switch 133 is in the state of connecting the third current supply section 13 to the gate terminal G of the IGBT 21, the third current supply section 13 can supply the third current Ic from the MOS transistor 131 to the gate terminal G of the IGBT 21. On the other hand, when the switch 133 is in the state of disconnecting the third current supply section 13 from the gate terminal G of the IGBT 21, the third current supply section 13 can cut off the supply of the third current Ic from the MOS transistor 131 to the gate terminal G of the IGBT 21.

Although the details will be described later, the gate drive circuit 10A can change the connected and disconnected states of the first current supply section 11, the second current supply section 12, and the third current supply section 13 to and from the gate terminal G according to the gate voltage Vg in the process of transitioning the IGBT 21 from the off state to the on state (that is, at the time of turn-on). This can prevent the gate drive circuit 10A from being switched to a low current consumption mode in which a gate capacitance is charged only with the second current Ib output from the second current supply section 12, at an unexpected timing. As a result, the gate drive circuit 10A can prevent a mirror period occurring during the turn-on period from becoming longer, thereby reducing a switching loss.

As illustrated in FIG. 2, a parasitic capacitance Cge is formed between the gate terminal G of the IGBT 21 and an emitter terminal E thereof. The parasitic capacitance Cge becomes the gate capacitance of the IGBT 21, and the gate current flows from the current mirror circuit 142 to the gate terminal G of the IGBT 21 via the gate voltage output terminal Tg to charge the parasitic capacitance Cge. Thus, the IGBT 21 is turned on and transitions from the off state to the on state.

The IGBT 21 has a current detection terminal S used for detecting at least one of an overcurrent and a short circuit current. The current detection terminal S is connected to a detection current input terminal Ti provided in the gate drive circuit 10A. Although not illustrated, the gate drive circuit 10A has a current detection unit connected to the detection current input terminal Ti. The current detection unit is configured to convert a detected current output from the current detection terminal S into a detected voltage and detect whether the overcurrent or the short circuit current is flowing through the IGBT 21, based on the converted detected voltage. When it is detected by the current detection unit that the overcurrent or the short circuit current is flowing through the IGBT 21, the gate drive circuit 10A cuts off the input of the gate current from the current mirror circuit 142 to the IGBT 21, for example. Thus, the operation of the IGBT 21 is stopped.

A cathode of the freewheel diode 22 connected in antiparallel to the IGBT 21 is connected to a collector terminal C of the IGBT 21. An anode of the freewheel diode 22 is connected to the emitter terminal E of the IGBT 21. The semiconductor element 20 having the IGBT 21 and the freewheel diode 22, and the gate drive circuit 10A are formed on a printed circuit board (not illustrated), for example, and have a module configuration packaged into one. For this reason, a parasitic inductance L due to a wiring and the like formed on the printed circuit board is connected to the semiconductor element 20.

The collector terminal C of the IGBT 21 included in each of the semiconductor device 2a, the semiconductor device 2c, and the semiconductor device 2e (refer to FIG. 1) is connected to the positive side line Lp (refer to FIG. 1). The emitter terminal E of the IGBT 21 included in the semiconductor device 2a is connected to the collector terminal C of the IGBT 21 included in the semiconductor device 2b (refer to FIG. 1). The emitter terminal E of the IGBT 21 included in the semiconductor device 2c is connected to the collector terminal C of the IGBT 21 included in the semiconductor device 2d (refer to FIG. 1). The emitter terminal E of the IGBT 21 included in the semiconductor device 2e is connected to the collector terminal C of the IGBT 21 included in the semiconductor device 2f (refer to FIG. 1). The emitter terminals E of the IGBTs 21 respectively included in the semiconductor device 2b, the semiconductor device 2d, and the semiconductor device 2f are connected to the negative side line Ln (refer to FIG. 1).

[Operation of Gate Drive Circuit]

The operation of the gate drive circuit 10A according to this embodiment will be described using FIGS. 2 and 3 and Table 1 while referring to FIG. 1. FIG. 3 is a diagram typically illustrating an example of operating waveforms at the time of turn-on of the IGBT 21. An upper stage of FIG. 3 illustrates an example of the operating waveforms of the IGBT 21 when driven by the gate drive circuit 10A. A lower stage of FIG. 3 illustrates an example of the operating waveforms of the IGBT 21 when driven by a gate drive circuit as a comparative example. "Vg" at the upper stage of FIG. 3 indicates the gate voltage applied to the gate terminal G of the IGBT 21 in this embodiment. "Ice" at the upper stage of FIG. 3 indicates a current between the collector and emitter of the IGBT 21 in this embodiment. "Vce" at the upper stage of FIG. 3 indicates a voltage between the collector and emitter of the IGBT 21 in this embodiment. "VgC" at the lower stage of FIG. 3 indicates a gate voltage applied to the gate terminal of the IGBT in the comparative example. "IceC" at the lower stage of FIG. 3 indicates a current between the collector and emitter of the IGBT in the comparative example. "VceC" at the lower stage of FIG. 3 indicates a voltage between the collector and emitter of the IGBT in the comparative example.

Figure 3:
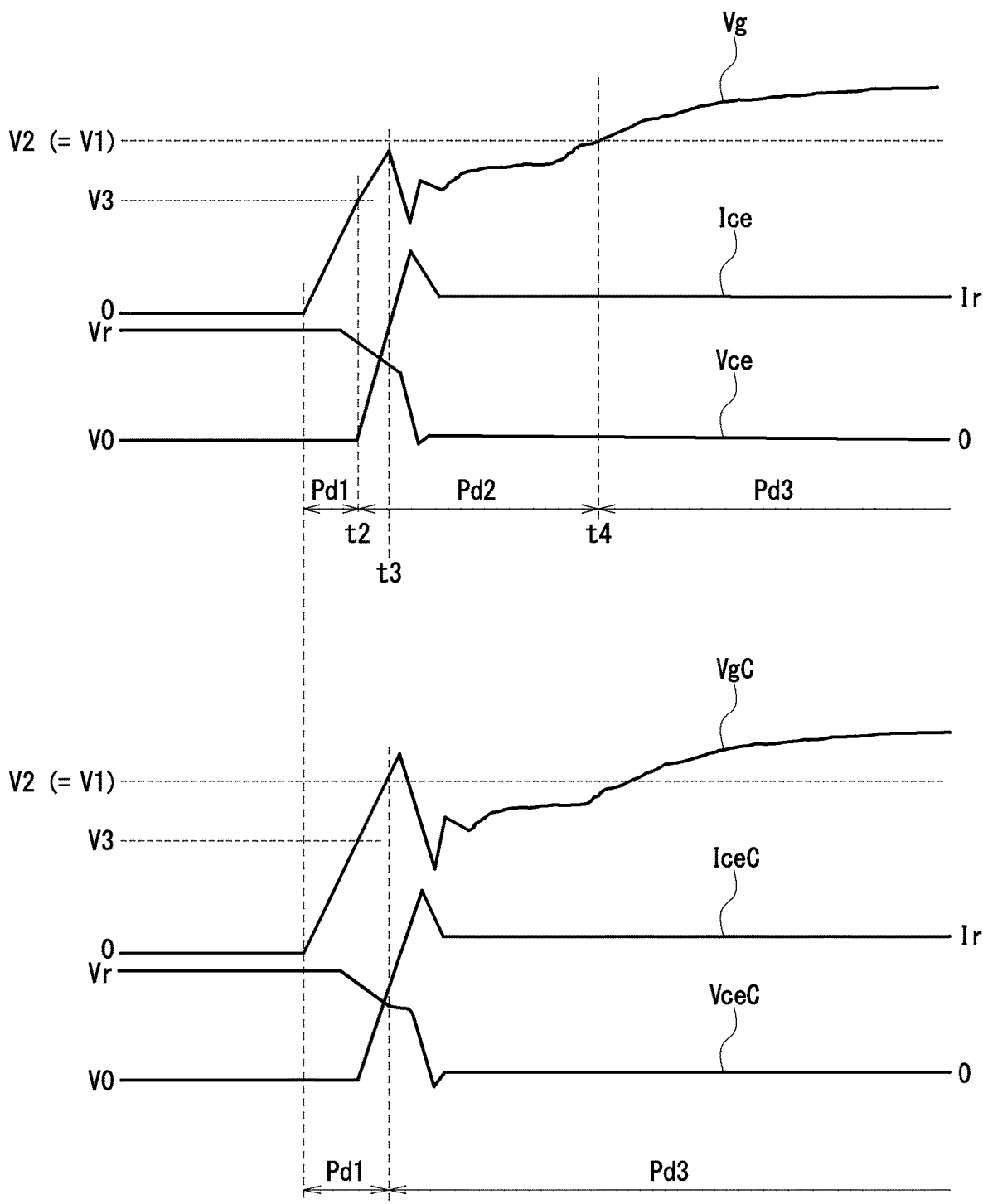
FIG. 3 is a diagram illustrating an example of operating waveforms of the gate drive circuit as the drive circuit of the switching element according to the first embodiment of the present invention.

"V2" in FIG. 3 indicates the second voltage generated in the voltage generating on part 125 provided in the second current supply section 12. At the upper stage of FIG. 3, it is represented as "V2 (=V1)" that the first voltage V1 is set to the same voltage value as the second voltage V2. "V3" in FIG. 3 indicates the third voltage generated by the voltage generating part 135 provided in the third current supply section 13. "Vr" in FIG. 3 indicates the rated value of the collector-emitter voltage of the IGBT 21. "Ir" in FIG. 3 indicates the rated value of the collector-emitter current of the IGBT 21. In FIG. 3, the reference potential (0V) of the gate voltage and the reference potential (0V) of the collector-emitter voltage are illustrated shifted to make it easier to understand.

"Pd1" in FIG. 3 indicates that the gate drive circuit 10A is during a period of a quick charging mode (details will be described later), which is one of operation modes for charging the gate capacitance of the IGBT 21. "Pd2" in FIG. 3 indicates that the gate drive circuit 10A is during a period of an overshoot suppression mode (detail will be described later), which is one of the operation modes for charging the gate capacitance of the IGBT 21. "Pd3" in FIG. 3 indicates that the gate drive circuit 10A is during a period of a low current consumption mode (details will be described later), which is one of the operation modes for charging the gate capacitance of the IGBT 21.

TABLE 1

| Gate Voltage | SW1 | SW2 | SW3 | IGBT Gate Charging Operation Mode | Gate Current | Period |
|---|---|---|---|---|---|---|
| 0 < Vg < V3 | On | Off | On | Quick Charging Mode | Ia + Ic | Pd1 |
| V3 < Vg < V2 | On | Off | Off | Overshoot suppression mode | Ia | Pd2 |
| V2 < Vg < Vc | Off | On | Off | Low Current Consumption mode | Ib | Pd3 |

Table 1 is a table which indicates the relationship among the height of the gate voltage Vg applied to the gate terminal G of the IGBT 21, the on/off states of the switch 112 provided in the first current supply section 11, the switch 124 provided in the second current supply section 12, and the switch 133 provided in the third current supply section 13, the operation mode for charging the gate capacitance of the IGBT 21, and the gate current supplied to the gate terminal G of the IGBT 21. The "gate voltage" in Table 1 indicates the gate voltage Vg applied to the gate terminal G of the IGBT 21.

"0<Vg<V3" in the "gate voltage" column in Table 1 indicates that the gate voltage Vg applied to the gate terminal G of the IGBT 21 is higher than 0 V and lower than the third voltage V3 generated by the voltage generating part 135 provided in the third current supply section 13. "V3<Vg<V2" in the "gate voltage" column in Table 1 indicates that the gate voltage Vg applied to the gate terminal G of the IGBT 21 is higher than the third voltage V3 generated by the voltage generating part 135 provided in the third current supply section 13 and lower than the second voltage V2 generated by the voltage generating part 125 provided in the second current supply section 12. "V2<Vg<Vc" in the "gate voltage" column in Table 1 indicates that the gate voltage Vg applied to the gate terminal G of the IGBT 21 is higher than the second voltage V2 generated by the voltage generating part 125 provided in the second current supply section 12 and lower than the comparison voltage Vc generated by the voltage generating part 127 provided in the second current supply section 12.

"SW1" in Table 1 indicates the switch 112 provided in the first current supply section 11. "SW2" in Table 1 indicates the switch 124 provided in the second current supply section 12. "SW3" in Table 1 indicates the switch 133 provided in the third current supply section 13. "On" in the "SW1" column in Table 1 indicates that the switch 112 is in the on state (conducting state), and "Off" in the corresponding column indicates that the switch 112 is in the off state (non-conducting state). "On" in the "SW2" column in Table 1 indicates that the switch 124 is in the on state (conducting state), and "Off" in the corresponding column indicates that the switch 124 is in the off state (non-conducting state). "On" in the "SW3" column in Table 1 indicates that the switch 133 is in the on state (conducting state), and "Off" in the corresponding column indicates that the switch 133 is in the off state (non-conducting state).

The "IGBT gate charging operation mode" in Table 1 indicates an operation mode for charging the gate capacitance formed in the IGBT 21 (that is, the parasitic capacitance Cge illustrated in FIG. 2). The "quick charging mode" in the "IGBT gate charging operation mode" column in Table 1 indicates a charging mode for turning on the IGBT 21 at high speed. The "low consumption current mode" in the "IGBT gate charging operation mode" column in Table 1 indicates a charging mode for increasing the gate voltage Vg applied to the IGBT 21 with a gate current small in current amount after the IGBT 21 has finished turning on. The "overshoot suppression mode" in the "IGBT gate charging operation mode" column in Table 1 indicates a charging mode for preventing a malfunction that the quick charging mode shifts to the low current consumption mode due to the overshoot of the gate voltage Vg which occurs while the IGBT 21 is being turned on.

The "gate current" in Table 1 indicates the gate current supplied to the gate terminal G of the IGBT21. "Ia+Ic" in the "gate current" column in Table 1 indicates a current obtained by combining the first current Ia output from the first current supply section 11 and the third current Ic output from the third current supply section 13. "Ia" in the "gate current" column in Table 1 indicates that the gate current is the first current Ia output from the first current supply section 11. "Ib" in the "gate current" column in Table 1 indicates that the gate current is the second current Ib output from the second current supply section 12.

In a period before a time t1 illustrated in the upper stage of FIG. 3, when an input signal Sin whose voltage level is at a high level is input from the control device 6 (refer FIG. 1) via the signal input terminal Ts (refer to FIG. 2), the gate signal generating section 14 provided in the gate drive circuit 10A is brought into a non-operating state and does not output a gate signal to the gate terminal G of the IGBT 21. More specifically, as illustrated in FIG. 2, the MOS transistor 144 is turned on when the input signal Sin whose signal level (i.e., voltage level) is at the high level is input to its gate. Therefore, since the gate terminal of the MOS transistor 143 is connected to the reference potential terminal Trp through the MOS transistor 144, the MOS transistor 143 is turned off. Thus, since the current mirror circuit 142 does not supply a current toward the reference potential terminal Trp, the gate signal generating section 14 does not output the gate signal to the gate terminal G of the IGBT 21. Also, in other words, when the input signal Sin whose signal level is at the high level is input from the control device 6, the gate signal generating section 14 outputs a gate signal whose signal level is at a low level to the IGBT 21. Therefore, the IGBT 21 is turned off. At this time, the collector-emitter voltage Vce of the IGBT 21 becomes a rated voltage Vr (for example, 400V).

Since the signal level of the gate signal of the IGBT 21 is at the low level, the gate voltage Vg applied to the gate terminal G of the IGBT 21 is lower than the second voltage V2, the third voltage V3, and the comparison voltage Vc. Therefore, the comparators 122 and 126 provided in the second current supply section 12 and the comparator 132 provided in the third current supply section 13 both output output signals whose signal levels are at a high level. Consequently, the buffer circuit 123a provided in the second current supply section 12 outputs an output signal whose signal level is at a high level, the XNOR circuit 123b provided in the second current supply section 12 outputs an operation signal whose signal level is at a high level, and the AND circuit 134a provided in the third current supply section 13 outputs an operation signal whose signal level is at a high level. As a result, the switch 112 provided in the first current supply section 11 is controlled to an on state (conducting state), the switch 124 provided in the second current supply section 12 is controlled to an off state (non-conducting state), and the switch 133 provided in the third current supply section 13 is controlled to an on state (conducting state). Therefore, before the IGBT 21 starts to turn on, the switches 112, 124, and 133 are controlled to the same state as during the period Pd1 for the quick charging mode as illustrated in Table 1.

At the time t1 illustrated in the upper stage of FIG. 3, for example, when an input signal Sin whose voltage level is at a low level is input from the control device 6 via the signal input terminal Ts, the gate signal generating section 14 is brought into an operating state and outputs a gate signal to the IGBT 21. More specifically, as illustrated in FIG. 2, since the input signal Sin whose voltage level is at the low level is input to the gate terminal of the MOS transistor 144, the MOS transistor 144 is turned off. Therefore, the gate terminal of the MOS transistor 143 is electrically cut off from the reference potential terminal Trp by the MOS transistor 144. Thus, since the output signal output from the amplifier 141 is input to the gate terminal of the MOS transistor 143, a predetermined constant current flows from the MOS transistor 142a provided in the current mirror circuit 142 to the MOS transistor 143 and the resistance element 146.

The switches 112 and 133 are controlled to the on state, and the switch 124 is controlled to the off state. Therefore, the first current Ia flows from the MOS transistor 111 provided in the current mirror circuit 142 to the gate terminal G of the IGBT 21 via the switch 112 and the gate voltage output terminal Tg, and the third current Ic flows from the MOS transistor 131 to the gate terminal G of the IGBT 21 via the switch 133 and the gate voltage output terminal Tg. On the other hand, the second current Ib supplied from the MOS transistor 121 does not flow through the gate terminal G of the IGBT 21.

Thus, the gate current flowing through the gate terminal G of the IGBT 21 becomes a current amount that is the sum of the first current Ia and the third current Ic. Therefore, the gate drive circuit 10A drives the IGBT 21 according to the quick charging mode from the time t1. As a result, as illustrated in the upper stage of FIG. 3, the IGBT 21 starts to turn on, and the gate voltage Vg of the IGBT 21 starts to rise sharply from the time t1. Since the gate voltage Vg of the IGBT 21 starts to rise, the collector-emitter voltage Vce of IGBT 21 starts to drop and the collector-emitter current Ice of the IGBT 21 starts to rise after a predetermined time has elapsed from the time t1.

When the signal level rises and thereby the gate voltage Vg applied to the gate terminal G of the IGBT 21 becomes lower than the second voltage V2 and higher than the third voltage V3, the comparator 132 provided in the third current supply section 13 outputs an output signal whose signal level is at a low level to the AND circuit 134a. On the other hand, in this case, the comparator 122 provided in the second current supply section 12 outputs an output signal whose signal level is at a high level to the buffer circuit 123a as before the time t1. Thus, the switch 112 provided in the first current supply section 11 maintains an on state, and the switch 124 provided in the second current supply section 12 maintains an off state, but the switch 133 provided in the third current supply section 13 is switched from an on state (conducting state) to an off state (non-conducting state). Therefore, since the second current supply section 12 is brought into a state of being disconnected (cut off) from the gate terminal G of the IGBT 21, the second current supply section 12 cannot supply the third current Ic to the gate terminal G of the IGBT 21, and hence the gate current supplied to the gate terminal G of the IGBT 21 becomes the first current Ia supplied from the first current supply section 11. As a result, as illustrated in the upper stage of FIG. 3 and Table 1, the gate drive circuit 10A switches the charging operation mode of the gate terminal G of the IGBT 21 from the quick charging mode to the overshoot suppression mode. Further, the collector-emitter voltage Vce of the IGBT 21 monotonously decreases at the timing (time t2) when the charging operation mode of the gate terminal G of the IGBT 21 is switched from the quick charging mode to the overshoot suppression mode.

As illustrated in the upper stage of FIG. 3, the gate voltage Vg applied to the gate terminal G of the IGBT 21 continues to rise even after the time t2 has passed, thereby causing an overshoot. However, the period in which the gate voltage Vg overshoots is the period Pd2 for the overshoot suppression mode in which the gate current is smaller than the period Pd1 for the quick charging mode. Therefore, the gate voltage Vg applied to the gate terminal G of the IGBT 21 will not be higher than the second voltage V2 that serves as a reference for switching to the low current consumption mode at a time t3 at which it becomes the maximum during the period of occurrence of the overshoot. As a result, the gate drive circuit 10A continues charging the gate terminal G of the IGBT 21 according to the overshoot suppression mode even after the time t3 has elapsed.

In the overshoot suppression mode, the gate capacitance (parasitic capacitance Cge) of the IGBT 21 is charged with a gate current larger in current amount than the second current Ib and the third current Ic (that is, the same magnitude as the first current Ia). Thus, the gate voltage Vg applied to the gate terminal G of the IGBT 21 continues to monotonously increase, although its increase is slower than in the quick charging mode.

When the gate drive circuit 10A continues to drive the IGBT 21 in the overshoot suppression mode to raise the signal level, and at a time t4, the gate voltage Vg applied to the gate terminal G of the IGBT 21 becomes lower than the comparison voltage Vc and higher than the second voltage V2, the comparator 122 provided in the second current supply section 12 outputs an output signal whose signal level is at a low level to the AND circuit 134a. On the other hand, in this case, the comparator 126 provided in the second current supply section 12 outputs an output signal whose signal level is at a high level to the XNOR circuit 123b as before the time t3. Thus, the switch 112 provided in the first current supply section 11 is switched from an on state (conducting state) to an off state (non-conducting state). Also, the switch 124 provided in the second current supply section 12 is switched from an off state (non-conducting state) to an on state (conducting state). Further, the switch 133 provided in the third current supply section 13 maintains an off state (non-conducting state). Therefore, the first current supply section 11 and the third current supply section 13 are brought into a state of being disconnected (cut off) from the gate terminal G of the IGBT 21. On the other hand, the second current supply section 12 is brought into a state of being connected to the gate terminal G of the IGBT 21. Thus, the first current Ia and the third current Ic cannot be supplied to the gate terminal G of the IGBT 21, and the gate current supplied to the gate terminal G of the IGBT 21 becomes the second current Ib supplied from the second current supply section 12. As a result, as illustrated in the upper stage of FIG. 3 and Table 1, the gate drive circuit 10A switches the charging operation mode of the gate terminal G of the IGBT 21 from the overshoot suppression mode to the low current consumption mode.

As illustrated in the upper stage of FIG. 3, at the timing (time t4) when the charging operation mode of the gate terminal G of the IGBT 21 is switched from the overshoot suppression mode to the low current consumption mode, the collector-emitter voltage Vce of the IGBT 21 is 0V, and the collector-emitter current Ice of the IGBT 21 becomes the rated current Ir (whose current value is 300 A, for example). Therefore, the IGBT 21 finishes its turn-on operation with the completion of the period Pd2 for the overshoot suppression mode.

Since the gate capacitance of the IGBT 21 continues to be charged by the gate current having the same current amount as that of the second current Ib even during the period Pd3 during which the low current consumption mode is executed, the gate voltage Vg applied to the gate terminal G of the IGBT 21 continues to rise. Although not illustrated, when the gate drive circuit 10A continues to drive the IGBT 21 in the low current consumption mode to raise the signal level and thereby the gate voltage Vg applied to the gate terminal G of the IGBT 21 becomes higher than the comparison voltage Vc, the comparator 126 provided in the second current supply section 12 outputs an output signal whose signal level is at a low level to the XNOR circuit 123b. On the other hand, in this case, the comparator 122 provided in the second current supply section 12 outputs an output signal whose signal level is at a low level to the buffer circuit 123a. Further, in this case, the comparator 132 provided in the third current supply section 13 outputs an output signal whose signal level is at a low level to the AND circuit 134a. Consequently, the switch 112 provided in the first current supply section 11 and the switch 124 provided in the second current supply section 12 maintain an off state (non-conducting state), and the switch 133 provided in the third current supply section 13 is switched from an on state (conducting state) to an off state (non-conducting state). Therefore, the first current supply section 11, the second current supply section 12, and the third current supply section 13 are brought into a state of being disconnected (cut off) from the gate terminal G of the IGBT 21. Consequently, no gate current is supplied to the gate terminal G of the IGBT 21.

Further, after that, the input signal Sin whose voltage level is at a low level is input from the control device 6 via the signal input terminal Ts. Thus, the MOS transistors 144 and 145 are turned off. Therefore, since the current is no longer supplied from the current mirror circuit 142, and the gate terminal G of the IGBT 21 is in an electrically floating state, the gate voltage Vg at the gate terminal G of the IGBT 21 is maintained at a voltage higher than the comparison voltage Vc and lower than the power supply voltage Vcc.

[Effect of Drive Circuit of Switching Element]

Next, the effect of the drive circuit of the switching element according to this embodiment will be described using FIGS. 3 and 4 while referring to FIG. 2 by taking the gate drive circuit 10A as an example. First, in describing the effect of the drive circuit of the switching element according to this embodiment, the operation of the gate drive circuit as a comparative example will be described with reference to FIG. 3. The gate drive circuit as the comparative example has the same configuration as that of the gate drive circuit 10A according to this embodiment, except that the third current supply section 13 is not provided. Further, an IGBT driven by the gate drive circuit as the comparative example and a parasitic inductance generated by being electrically connected to the IGBT will be described using the same reference numerals as those of the IGBT 21 and the parasitic inductance L illustrated in FIG. 2.

As with the IGBT 21 driven by the gate drive circuit 10A, in the IGBT 21 driven by the gate drive circuit as the comparative example, the gate voltage VgC thereof increases due to the voltage generated in the parasitic inductance L (refer to FIG. 2) due to the flow of the collector-emitter current IceC. Unlike the IGBT 21 driven by the gate drive circuit 10A, the IGBT 21 driven by the gate drive circuit as the comparative example is not transitioned from the quick charging mode to the overshoot suppression mode even if the gate voltage VgC becomes higher than the third voltage V3. Therefore, as illustrated in the lower stage of FIG. 3, the gate voltage VgC applied to the gate terminal G of the IGBT 21 driven by the gate drive circuit as the comparative example becomes larger than the second voltage V2 at a time t2a due to the occurrence of an overshoot in the gate voltage VgC at the time of turn-on of the IGBT 21.

Figure 4A:
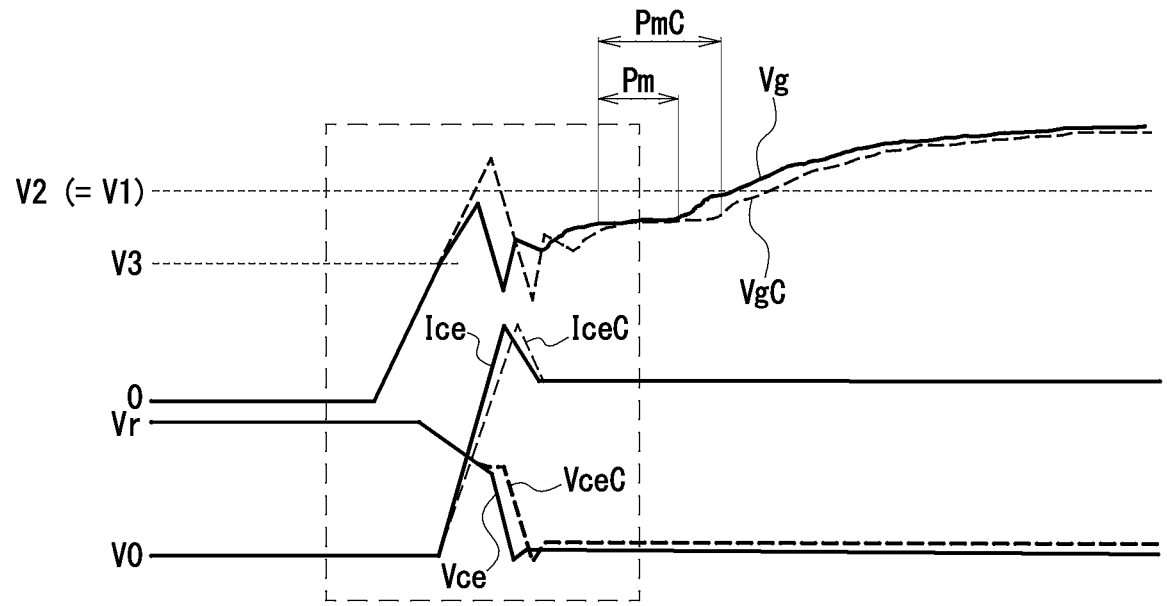
FIGS. 4A and 4B are a diagram for explaining the effect of the gate drive circuit as the drive circuit of the switching element according to the first embodiment of the present invention.
Figure 4B:
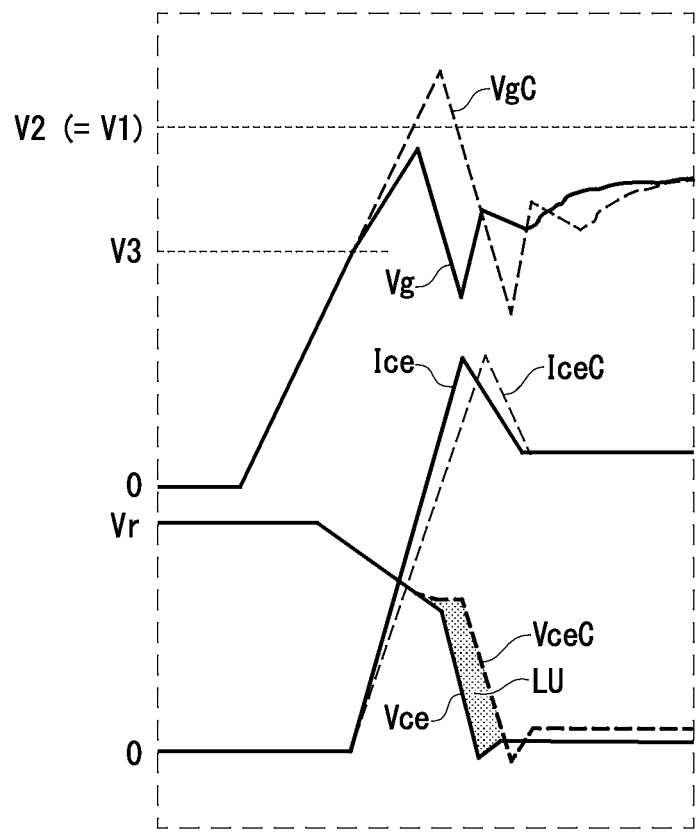

FIGS. 4A and 4B are a diagram illustrating the superposition of operating waveforms of the IGBT 21 driven by the gate drive circuit 10A and operating waveforms of the IGBT 21 driven by the gate drive circuit as the comparative example. FIG. 4A is a diagram illustrating a state in which the operating waveforms of the IGBTs 21 driven by the gate drive circuit 10A and the gate drive circuit as the comparative example respectively are superimposed in the same magnitudes as the operating waveforms illustrated in FIG. 3. FIG. 4B is a diagram illustrating in an enlarged form, the region of a dashed square frame illustrated in FIG. 4A. The solid line operating waveforms illustrated in FIGS. 4A and 4B indicate the operating waveforms of the IGBT 21 driven by the gate drive circuit 10A. The broken line operating waveforms illustrated in FIGS. 4A and 4B indicate the operating waveforms of the IGBT 21 driven by the gate drive circuit as the comparative example. "Vg", "Vice", "Ice", "VgC", "VceC", "IceC", "V2", and "V3" illustrated in FIGS. 4A and 4B are the same contents as those of "Vg", "Vce", "Ice", "VgC", "VceC", "IceC", "V2", and "V3" illustrated in FIG. 3, and the description thereof will therefore be omitted.

The gate current in the overshoot suppression mode (that is, the first current Ia) is larger in current value than the gate current in the low current consumption mode (that is, the second current Ib). Therefore, the overshoot suppression mode can charge the gate capacitance of the IGBT 21 faster than the low current consumption mode. Thus, as illustrated in FIG. 4A, a mirror period Pme of the gate voltage Vg applied to the gate terminal G of the IGBT 21 driven by the gate drive circuit 10A becomes shorter than a mirror period Pmc of the gate voltage VgC applied to the gate terminal G of the IGBT 21 driven by the gate drive circuit as the comparative example. As a result, the gate voltage Vg of the IGBT 21 driven by the gate drive circuit 10A becomes higher than the second voltage V2 earlier than the gate voltage VgC of the IGBT 21 driven by the gate drive circuit as the comparative example. That is, the IGBT 21 driven by the gate drive circuit 10A finishes the turn-on operation earlier than the IGBT 21 driven by the gate drive circuit as the comparative example.

Thus, as illustrated in FIG. 4B, the collector-emitter voltage Vce of the IGBT 21 driven by the gate drive circuit 10A falls faster than the collector-emitter voltage VceC of the IGBT 21 driven by the gate drive circuit as the comparative example. Therefore, a difference is generated between the collector-emitter voltage Vce of the IGBT 21 driven by the gate drive circuit 10A and the collector-emitter voltage VceC of the IGBT 21 driven by the gate drive circuit as the comparative example, and the difference indicated by oblique lines in FIG. 4B becomes a loss improvement LU.

Thus, the gate drive circuit 10A according to this embodiment can quickly charge the gate capacitance of the IGBT 21 while suppressing the overshoot compared to the gate drive circuit that does not execute the overshoot suppression mode when the IGBT 21 performs the turn-on operation. Consequently, the gate drive circuit 10A according to this embodiment can reduce a switching loss at the turn-on operation compared to the gate drive circuit that does not execute the overshoot suppression mode when the IGBT 21 performs the turn-on operation. Further, the intelligent power module 2 including the gate drive circuit 10A according to this embodiment can obtain the same effect as the gate drive circuit 10A.

As described above, the gate drive circuit 10A according to this embodiment includes the first current supply section 11 which supplies the first current Ia to the gate terminal G when the gate voltage Vg of the gate terminal G provided in the IGBT 21 is lower than the first voltage V1, the second current supply section 12 which supplies the second current Ib smaller than the first current Ia to the gate terminal G when the gate voltage Vg of the gate terminal G is higher than the second voltage V2 which is the same as or higher than the first voltage V1, and the third current supply section 13 which supplies the third current Ic smaller than the first current Ia and larger than the second current Ib to the gate terminal G when the gate voltage Vg of the gate terminal G is lower than the third voltage V3 which is lower than the first voltage V1.

Thus, the gate drive circuit 10A according to this embodiment can prevent deterioration of the switching loss of the IGBT 21.

Further, the intelligent power module 2 according to this embodiment includes a plurality of semiconductor devices (six semiconductor devices 2a to 2f in this embodiment) each having the semiconductor element 20 having the IGBT 21 and the freewheel diode 22 connected in antiparallel to the IGBT 21, and the gate drive circuit 10A according to this embodiment.

Thus, the intelligent power module 2 according to this embodiment can prevent deterioration of the switching loss of the IGBT 21 in a manner similar to the gate drive circuit 10A.

Second Embodiment

A drive circuit of a switching element and an intelligent power module according to a second embodiment of the present invention will be described with reference to FIG. 5. The intelligent power module according to this embodiment has the same configuration as and develops the same function as the intelligent power module 2 according to the first embodiment, except that the configuration of the drive circuit of the switching element is different, and the description thereof will therefore be omitted.

[Configuration of Drive Circuit of Switching Element]

The drive circuit of the switching element according to this embodiment is characterized in that a detected current detected at a current detection terminal is used as a voltage based on a voltage at a control signal input terminal. Components having the same operations and functions as the components of the gate drive circuit 10A according to the first embodiment are denoted by the same reference numerals, and the description thereof will be omitted. FIG. 5 is a circuit diagram illustrating an example of a schematic configuration of a gate drive circuit 10B as a switching element according to this embodiment.

Figure 5:
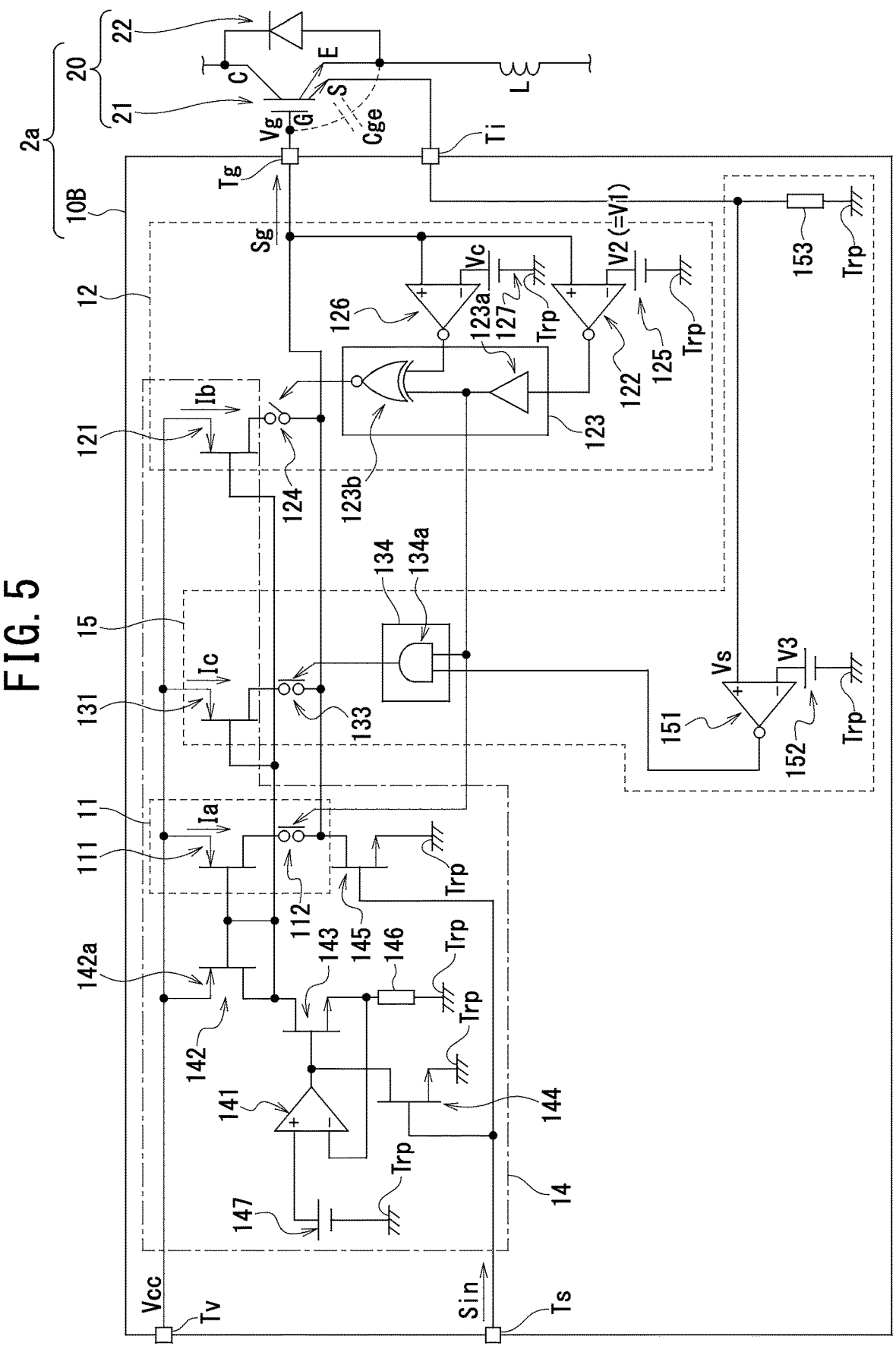
FIG. 5 is a circuit diagram illustrating an example of a schematic configuration of a gate drive circuit as a drive circuit of a switching element according to a second embodiment of the present invention.

As illustrated in FIG. 5, the gate drive circuit 10B includes a gate signal generating section 14 which generates a gate signal (an example of a control signal) Sg for controlling an IGBT 21 using an input signal Sin input from a control device 6 (refer to FIG. 1). Also, the gate drive circuit 10B includes a first current supply section 11 which supplies a first current Ia to a gate terminal G provided in the IGBT (an example of a switching element) 21 when a gate voltage (an example of the voltage) Vg of the gate terminal G is lower than a first voltage V1. Further, the gate drive circuit 10B includes a second current supply section 12 which supplies a second current Ib smaller than the first current Ia to the gate terminal G when the gate voltage Vg of the gate terminal G is higher than a second voltage V2 which is the same as or higher than the first voltage V1. In this embodiment, the first voltage V1 and the second voltage V2 are set to the same voltage value.

Further, the gate drive circuit 10B includes a third current supply section 15 which supplies a third current Ic smaller than the first current Ia and larger than the second current Ib to the gate terminal G when the gate voltage (an example of the voltage) Vg of the gate terminal (an example of the control signal input terminal) G of the IGBT 21 is lower than a third voltage V3 lower than the first voltage V1. The first voltage V1, the second voltage V2, the first current Ia, the second current Ib, and the third current Ic in this embodiment are set as with the first voltage V1, the second voltage V2, the first current Ia, the second current Ib, and the third current Ic in the first embodiment. Although the details will be described later, the third voltage V3 in this embodiment is set differently from the third voltage V3 in the first embodiment.

The third current supply section 15 has a comparator 151 (an example of a third comparing part) which compares a detected voltage (an example of the voltage based on the voltage of the control signal input terminal) Vs and the third voltage V3. The third current supply section has a switch 133 (an example of a third changeover switch) which switches between a disconnected state of the third current supply section 15 from the gate terminal G and a connected state of the third current supply section 15 to the gate terminal G, based on the signal level of an output signal output from a comparator 122 and the signal level of an output signal output from the comparator 151.

Further, the third current supply section 15 has a resistance element 153 connected between a current detection terminal S of the IGBT 21 and a reference potential terminal Trp, and a voltage generating part 152 which generates the third voltage V3. Specifically, one terminal of the resistance element 153 is connected to a detection current input terminal Ti. Thus, the resistance element 153 is connected to the current detection terminal S via the detection current input terminal Ti. The other terminal of the resistance element 153 is connected to the reference potential terminal Trp. The third current supply section 15 is configured to output, as the detected voltage Vs, a voltage drop occurring in the resistance element 153 by the detected current output from the current detection terminal S flowing through the resistance element 153. That is, the third current supply section 15 outputs a voltage at the one terminal of the resistance element 153 connected to the current detection terminal S as the detected voltage Vs.

The voltage generating part 152 is configured by a DC power supply, for example. A negative side of the voltage generating part 152 is connected to the reference potential terminal Trp. The voltage generating part 152 is adapted to generate the third voltage V3. The third voltage V3 in this embodiment is set to the same voltage as the voltage drop occurring in the resistance element 153 by the detected current flowing through the current detection terminal S flowing through the resistance element 153 when the third voltage V3 in the first embodiment is applied to the gate terminal G of the IGBT 21. The detected current flowing through the current detection terminal S when the third voltage V3 is applied to the gate terminal G of the IGBT 21 is obtained by operation tests and operation simulations of the IGBT 21, for example.

The comparator 151 is, for example, a hysteresis comparator comprised of an operational amplifier and an unillustrated resistance element. A non-inversion input terminal (+) of the comparator 151 is connected to a connecting portion of one terminal of the resistance element 153 and the reference potential terminal Trp. A positive side of the voltage generating part 152 is connected to an inversion input terminal (−) of the comparator 151. A NOT output terminal of the comparator 151 is connected to one input terminal of an AND circuit 134a provided in a logic circuit unit 134.

When the detected voltage Vs (i.e., voltage corresponding to the gate voltage Vg of the gate terminal G of the IGBT 21) based on the detected current flowing through the current detection terminal S is lower than the third voltage V3 generated in the voltage generating part 152, the comparator 151 outputs an output signal whose signal level (i.e., voltage level) is at a high level. Further, the comparator 151 outputs an output signal whose signal level is at a low level when the detected voltage Vs based on the detected current is higher than the third voltage V3.

Thus, the operation of the comparator 151 in this embodiment with respect to the level of the detected voltage Vs (that is, the gate voltage Vg) and the third voltage V3, and the operation of the comparator 132 in the first embodiment with respect to the level of the gate voltage Vg and the third voltage V3 are the same. Further, the AND circuit 134a to which the output terminal of the comparator 151 is connected, and the switch 133 to which the output terminal of the AND circuit 134a is connected have the same configurations as the AND circuit 134a and the switch 133 in the first embodiment. Therefore, the third current supply section can operate in the same manner as the third current supply section 13 in the first embodiment and exhibit the same function.

[Operation of Drive Circuit of Switching Element]

The gate drive circuit 10B as the drive circuit of the switching element according to this embodiment is the same as the gate drive circuit 10A according to the first embodiment except that the detected current flowing through the current detection terminal S in the third current supply section 15 is used to switch from the quick charging mode to the overshoot suppression mode, and the description thereof will therefore be omitted.

As described above, the gate drive circuit 10B according to this embodiment includes the first current supply section 11 which supplies the first current Ia to the gate terminal G when the gate voltage Vg of the gate terminal G provided in the IGBT 21 is lower than the first voltage V1, the second current supply section 12 which supplies the second current Ib smaller than the first current Ia to the gate terminal G when the gate voltage Vg of the gate terminal G is higher than the second voltage V2 which is the same as or higher than the first voltage V1, and the third current supply section 15 which supplies the third current Ic smaller than the first current Ia and larger than the second current Ib to the gate terminal G when the gate voltage Vg of the gate terminal G is lower than the third voltage V3 lower than the first voltage V1.

Thus, the gate drive circuit 10B according to this embodiment can prevent deterioration of a switching loss of the IGBT 21.

Further, the intelligent power module according to this embodiment includes a plurality of semiconductor devices (six semiconductor devices 2a to 2f in this embodiment (refer to FIG. 1)) each having a semiconductor element 20 (refer to FIG. 5) having an IGBT 21 and a freewheel diode 22 connected in antiparallel to the IGBT 21, and the gate drive circuit 10B according to this embodiment.

Thus, the intelligent power module according to this embodiment can prevent deterioration of the switching loss of the IGBT 21 as with the gate drive circuit 10B.

Third Embodiment

A drive circuit of a switching element and an intelligent power module according to a third embodiment of the present invention will be described with reference to FIG. 6. The intelligent power module according to this embodiment has the same configuration as and develops the same function as the intelligent power module 2 according to the first embodiment, except that the configuration of the drive circuit of the switching element is different, and the description thereof will therefore be omitted.

[Configuration of Drive Circuit of Switching Element]

The drive circuit of the switching element according to this embodiment is characterized in that each of a gate voltage and a detected current detected at a current detection terminal are used as a voltage based on a voltage at a control signal input terminal. Components having the same operations and functions as the components of the gate drive circuit 10A according to the first embodiment are denoted by the same reference numerals, and the description thereof will be omitted. FIG. 6 is a circuit diagram illustrating an example of a schematic configuration of a gate drive circuit 10C as a switching element according to this embodiment.

Figure 6:
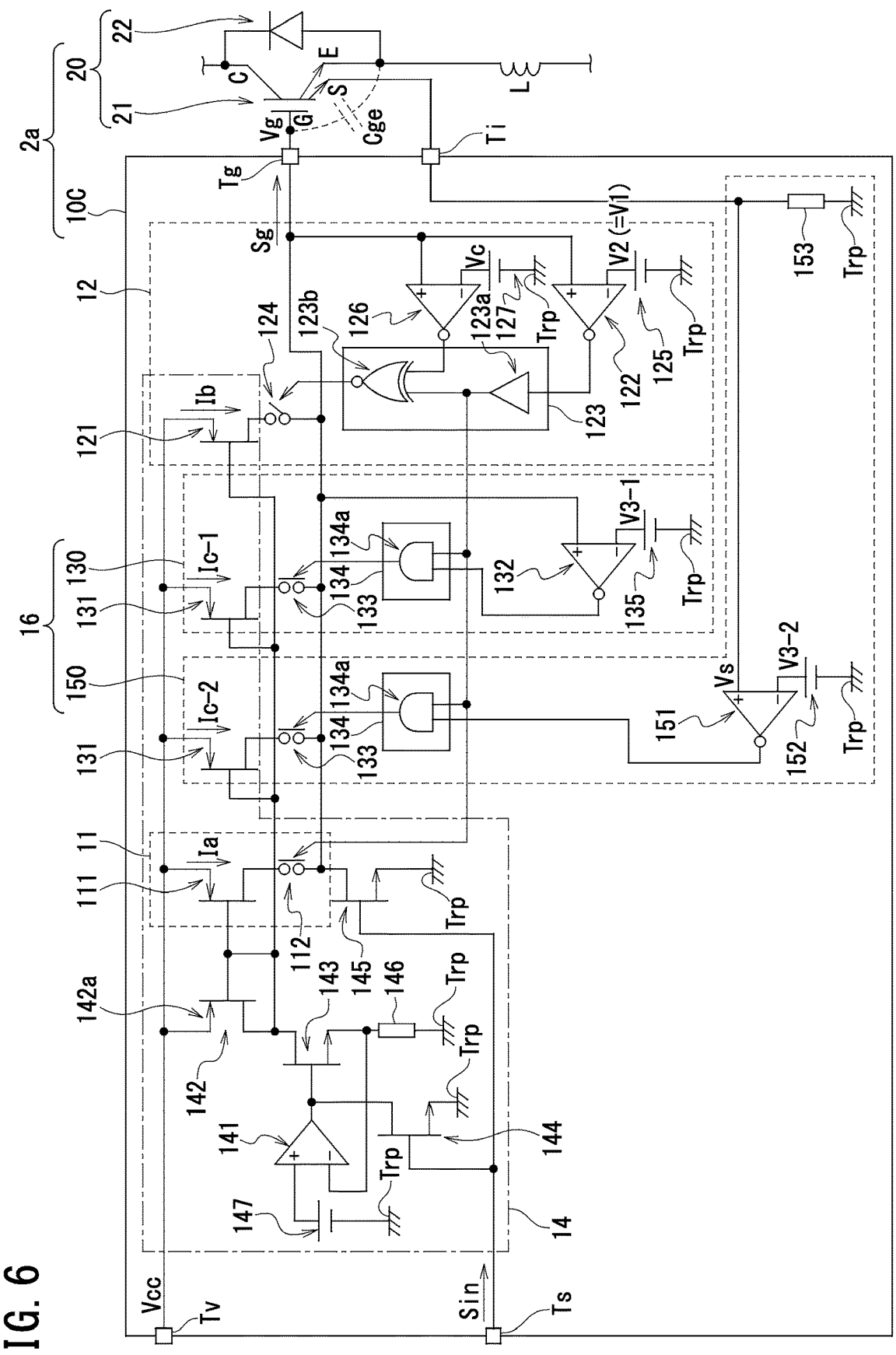
FIG. 6 is a circuit diagram illustrating an example of a schematic configuration of a gate drive circuit as a drive circuit of a switching element according to a third embodiment of the present invention.

As illustrated in FIG. 6, the gate drive circuit 10C includes a gate signal generating section 14 which generates a gate signal (an example of a control signal) Sg for controlling an IGBT 21 using an input signal Sin input from a control device 6 (refer to FIG. 1). Also, the gate drive circuit 10C includes a first current supply section 11 which supplies a first current Ia to a gate terminal G provided in the IGBT (an example of a switching element) 21 when a gate voltage (an example of the voltage) Vg of the gate terminal G is lower than a first voltage V1. Further, the gate drive circuit 10C includes a second current supply section 12 which supplies a second current Ib smaller than the first current Ia to the gate terminal G when the gate voltage Vg of the gate terminal G is higher than a second voltage V2 which is the same as or higher than the first voltage V1. In this embodiment, the first voltage V1 and the second voltage V2 are set to the same voltage value.

Further, the gate drive circuit 10C includes a third current supply section 16 which supplies third currents Ic-1 and Ic-2 smaller than the first current Ia and larger than the second current Ib to the gate terminal G when the gate voltage (an example of the voltage) Vg of the gate terminal (an example of the control signal input terminal) G of the IGBT 21 is lower than third voltages V3-1 and V3-2 lower than the first voltage V1.

As illustrated in FIG. 6, the third current supply section 16 has a current supply section 130 which has the same configuration as and develops the same function as the third current supply section 13 in the first embodiment, and a current supply section 150 which has the same configuration as and develops the same function as the third current supply section 15 in the second embodiment except that the set value of the third voltage V3 differs. The third voltage V3-1 set in the current supply section 130 is set to the same voltage as the third voltage V3 set in the third current supply section 13 in the first embodiment. The third voltage V3-2 set in the current supply section 130 is set to, for example, a voltage lower than the third voltage V3 set in the third current supply section 13 in the first embodiment. Also, the third current Ic-1 and the third current Ic-2 are set to a current value smaller than the third current Ic set in the first embodiment. Further, the combined current value of the third currents Ic-1 and Ic-2 is set to a current value smaller than the third current Ic set in the first embodiment. Therefore, the gate drive circuit 10C is capable of charging a gate capacitance of the IGBT 21 stepwise in the overshoot suppression mode. Consequently, the gate drive circuit 10C can charge the gate capacitance of the IGBT 21 more flexibly in the overshoot suppression mode.

[Operation of Drive Circuit of Switching Element]

Although the gate drive circuit 10C as the drive circuit of the switching element according to this embodiment charges the gate capacitance of the IGBT 21 stepwise in the overshoot suppression mode, the operation of the current supply section 130 is similar to that of the third current supply section 13, and the operation of the current supply section 150 is similar to that of the third current supply section 15, and the description thereof will therefore be omitted.

As described above, the gate drive circuit 10C according to this embodiment includes the first current supply section 11 which supplies the first current Ia to the gate terminal G provided in the IGBT 21 when the gate voltage Vg of the gate terminal G is lower than the first voltage V1, the second current supply section 12 which supplies the second current Ib smaller than the first current Ia to the gate terminal G when the gate voltage Vg of the gate terminal G is higher than the second voltage V2 which is the same as or higher than the first voltage V1, and the third current supply section 16 which supplies the third currents Ic-1 and Ic-2 smaller than the first current Ia and larger than the second current Ib to the gate terminal G when the gate voltage Vg of the gate terminal G is lower than the third voltages V3-1 and V3-2 lower than the first voltage V1.

Thus, the gate drive circuit 10C according to this embodiment can prevent deterioration of a switching loss of the IGBT 21.

Further, the intelligent power module according to this embodiment includes a plurality of semiconductor devices (six semiconductor devices 2a to 2f in this embodiment (refer to FIG. 1)) each having a semiconductor element 20 (refer to FIG. 6) having an IGBT 21 and a freewheel diode 22 connected in antiparallel to the IGBT 21, and the gate drive circuit 10C according to this embodiment.

Thus, the intelligent power module according to this embodiment can prevent deterioration of the switching loss of the IGBT 21 as with the gate drive circuit 10C.

Fourth Embodiment

A drive circuit of a switching element and an intelligent power module according to a fourth embodiment of the present invention will be described with reference to FIG. 7. The intelligent power module according to this embodiment has the same configuration as and develops the same function as the intelligent power module 2 according to the first embodiment, except that the configuration of the drive circuit of the switching element is different, and the description thereof will therefore be omitted.

[Configuration of Drive Circuit of Switching Element]

The drive circuit of the switching element according to this embodiment is characterized in that it reduces a gate current for charging a gate capacitance of an IGBT in a quick charging mode, an overshoot suppression mode, and a low current consumption mode in this order. Components having the same operations and functions as the components of the gate drive circuit 10A according to the first embodiment are denoted by the same reference numerals, and the description thereof will be omitted. FIG. 7 is a circuit diagram illustrating an example of a schematic configuration of a gate drive circuit 10D as a switching element according to this embodiment.

Figure 7:
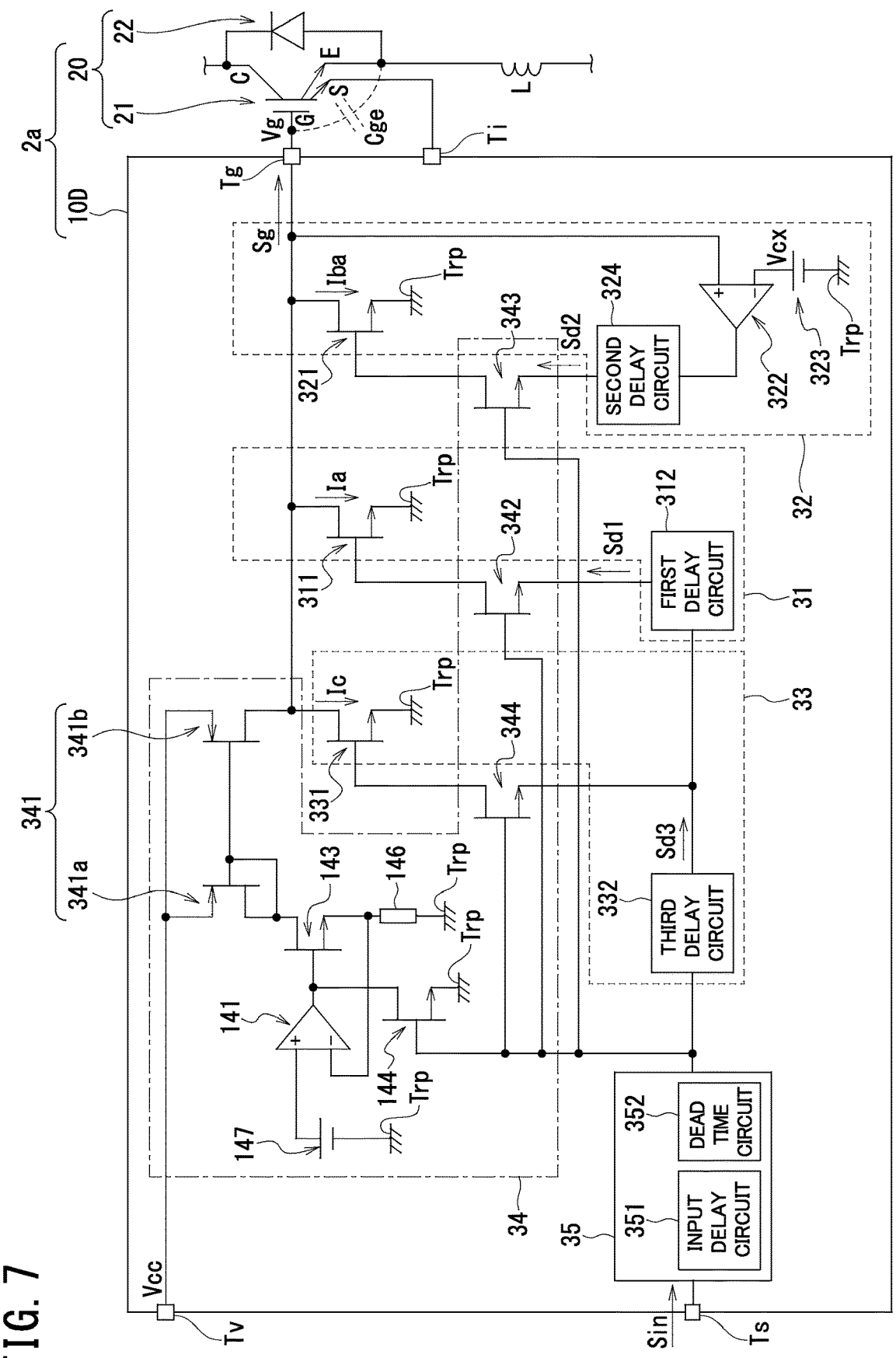
FIG. 7 is a circuit diagram illustrating an example of a schematic configuration of a gate drive circuit as a drive circuit of a switching element according to a fourth embodiment of the present invention.

As illustrated in FIG. 7, the gate drive circuit 10D includes a delay circuit unit 35 which delays an input signal Sin input from a control device 6 (refer to FIG. 1) via a signal input terminal Ts. The delay circuit unit 35 has an input delay circuit 351 input with the input signal Sin, and a dead time circuit 352 input with a delay signal delayed by the input delay circuit 351. An input terminal of the input delay circuit 351 is connected to a signal input terminal Ts, and an output terminal of the input delay circuit 351 is connected to an input terminal of the dead time circuit 352. An output terminal of the dead time circuit 352 is connected to a gate terminal of a MOS transistor 144 (details will be described later) provided in a gate signal generating section 34 and an input terminal of a third delay circuit 332 provided in a third current supply section 33 (details of both will be described later). The dead time circuit 352 adjusts the output timing of the input signal Sin from the delay circuit unit 35 to prevent the occurrence of a period during which an IGBT of an upper arm semiconductor device and an IGBT of a lower arm semiconductor device (in FIG. 7, an IGBT of a semiconductor device 2a and an IGBT of a semiconductor device 2b) simultaneously turn on.

As illustrated in FIG. 7, the gate signal generating section 34 included in the gate drive circuit 10D has a voltage generating part 147, an amplifier 141, a MOS transistor 143, and a resistance element 146 which have the similar configuration as and develop the similar function as the gate signal generating section 34 in the first embodiment. The MOS transistor 144 in this embodiment has the same configuration as and exhibits the same function as the MOS transistor 144 in the first embodiment except that an on/off state (conduction/non-conduction state) thereof is controlled by the input signal Sin delayed by the delay circuit unit 35.

The gate signal generating section 34 has a current mirror circuit 341 connected to a drain terminal of the MOS transistor 143. The current mirror circuit 341 has a MOS transistor 341a and a MOS transistor 341b whose gate terminals are connected to each other. Each of the MOS transistor 341a and the MOS transistor 341b is comprised of a P-type MOS transistor, for example. A source terminal of the MOS transistor 341a is connected to a power supply input terminal Tv input with a power supply voltage Vcc. A drain terminal of the MOS transistor 341a is connected to the gate terminal of the MOS transistor 341a and the drain terminal of the MOS transistor 143.

A predetermined constant current flows through the MOS transistor 341a provided in the current mirror circuit 341 by a constant current circuit comprised of the amplifier 141, the MOS transistor 143, and the resistance element 146. Further, the current mirror circuit 341 outputs, for example, the same amount of current as the constant current from the MOS transistor 341b to a gate terminal G of the IGBT 21 as a gate current. The current mirror circuit 341 is configured to supply a current obtained by combining a first current Ia and a third current Ic from the MOS transistor 341b to the gate terminal G of the IGBT 21 in the quick charging mode. On the other hand, when the MOS transistor 144 is turned on, the current mirror circuit 341 cannot pass a current from the MOS transistor 341a to the MOS transistor 143 and the resistance element 146. Therefore, it is not possible to pass a gate current from the MOS transistor 341b to the gate terminal G of the IGBT 21.

The gate signal generating section 34 has MOS transistors 342, 343, and 344 whose on/off states (conducting/non-conducting states) are controlled by the input signal Sin delayed by the delay circuit unit 35. Each of the MOS transistors 342, 343, and 344 is an N-type MOS transistor, for example. Gate terminals of the MOS transistors 342, 343, and 344 are connected to the signal input terminal Ts. A source terminal of the MOS transistor 342 is connected to an output terminal of a first delay circuit 312 (details will be described later). A drain terminal of the MOS transistor 342 is connected to a gate terminal of a switch 311 (details will be described later). A source terminal of the MOS transistor 343 is connected to an output terminal of a second delay circuit 324 (details will be described later). A drain terminal of the MOS transistor 343 is connected to a gate terminal of a switch 321 (details will be described later). A source terminal of the MOS transistor 344 is connected to a connecting portion of an output terminal of the third delay circuit 332 (details will be described later) and the first delay circuit 312. A drain terminal of the MOS transistor 344 is connected to a gate terminal of a switch 331 (details will be described later). Although the details will be described later, the MOS transistors 342, 343, and 344 are provided to maintain a gate voltage while causing the gate terminal G of the IGBT 21 to be in an electrically floating state after the IGBT 21 is transitioned from an off state (non-conducting state) to an on state (conducting state).

As illustrated in FIG. 7, the gate drive circuit 10D includes the gate signal generating section 34 which generates a gate signal (an example of a control signal) Sg to control the IGBT 21 by using the input signal Sin input from the control device 6 (refer to FIG. 1). Also, the gate drive circuit 10D includes a first current supply section 31 which supplies a first current Ia to the gate terminal G when the gate voltage (an example of the voltage) Vg of the gate terminal G (an example of a control signal input terminal) provided in the IGBT (an example of the switching element) 21 is lower than a first voltage V1. Further, the gate drive circuit 10D includes a second current supply section 32 which supplies a second current Ib smaller than the first current Ia to the gate terminal G when the gate voltage Vg of the gate terminal G is higher than a second voltage V2 which is the same as or higher than the first voltage V1. In this embodiment, the first voltage V1 is set to a voltage higher than the second voltage V2. In addition, the gate drive circuit 10D includes a third current supply section 33 which supplies third currents Ic-1 and Ic-2 smaller than the first current Ia and larger than the second current Ib to the gate terminal G when the gate voltage (an example of the voltage) Vg of the gate terminal (an example of the control signal input terminal) G of the IGBT 21 is lower than third voltages V3-1 and V3-2 lower than the first voltage V1.

As illustrated in FIG. 7, the second current supply section 32 has a comparator 322 (an example of a second comparison part) which compares the gate voltage (an example of a voltage based on the voltage of the control signal input terminal) Vg and a comparison voltage Vcx. The second current supply section 32 has the second delay circuit 324 which delays an output signal output from the comparator 322. The second current supply section 32 has a switch 321 (an example of a second changeover switch) which switches between a disconnected state of the second current supply section 32 from the gate terminal G of the IGBT 21 and a connected state of the second current supply section 32 to the gate terminal G of the IGBT 21, based on the signal level of a second delay signal Sd2 output from the second delay circuit 324.

The switch 321 is comprised of an N-type MOS transistor, for example. One terminal (a drain terminal, for example) of the switch 321 is connected to a gate voltage output terminal Tg. Therefore, one terminal of the switch 321 is connected to the gate terminal G of the IGBT 21 via the gate voltage output terminal Tg. The other terminal (a source terminal, for example) of the switch 321 is connected to a reference potential terminal Trp. A control signal input terminal (a gate terminal, for example) of the switch 321 is connected to the drain terminal of the MOS transistor 343.

The second current supply section 32 has a voltage generating part 323 which generates a comparison voltage Vcx. The voltage generating part 323 is configured by a DC power supply, for example. A negative side of the voltage generating part 323 is connected to the reference potential terminal Trp. The comparison voltage Vcx is set to a voltage at which it can be assumed that charging of the gate terminal G of the IGBT 21 is completed, that is, turn-on of the IGBT 21 is ended, after the delay time of the second delay circuit 324 has elapsed. That is, the comparison voltage Vcx is set to a voltage (that is, a voltage lower than the gate voltage Vg) before reaching the gate voltage Vg which allows the IGBT 21 to supply the motor 7 with the minimum current required to operate the motor 7 (refer to FIG. 1).

The comparator 322 is, for example, a hysteresis comparator comprised of an operational amplifier and an unillustrated resistance element. A non-inversion input terminal (+) of the comparator 322 is connected to the gate voltage output terminal Tg provided in the gate drive circuit 10D. The gate terminal G of the IGBT 21 is connected to the gate voltage output terminal Tg. Therefore, the non-inversion input terminal (+) of the comparator 322 is connected to the gate terminal G of the IGBT 21 via the gate voltage output terminal Tg. A positive side of the voltage generating part 323 is connected to an inversion input terminal (−) of the comparator 322. An output terminal of the comparator 322 is connected to an input terminal of the second delay circuit 324.

The comparator 322 outputs an output signal whose signal level (that is, voltage level) is at a low level when the gate voltage Vg of the gate terminal G of the IGBT 21 is lower than the comparison voltage Vcx generated by the voltage generating part 323. Further, the comparator 322 outputs an output signal whose signal level is at a high level when the gate voltage Vg is higher than the comparison voltage Vcx.

The output terminal of the second delay circuit 324 is connected to the source terminal of the MOS transistor 343. The second delay circuit 324 outputs to the MOS transistor 343, the second delay signal Sd2 obtained by delaying the output signal input from the comparator 322 by a predetermined time. For example, when an output signal whose signal level is at a high level is input, the second delay circuit 324 may be configured to output the output signal after the time only for the delay time has elapsed. Also, the second delay circuit 324 may have a plurality of inverter circuits or a plurality of buffer circuits, and may be configured to delay the output signal input from the comparator 322. Further, the second delay circuit 324 may be configured to delay the output signal input from the comparator 322 by a circuit combining passive elements such as resistive elements. The second delay circuit 324 delays the output signal input from the comparator 322 by 3.5 μs, for example to generate the second delay signal Sd2.

When the MOS transistor 343 is in an on state (conducting state), the second delay signal Sd2 output from the second delay circuit 324 is input to the control signal input terminal of the switch 321 via the MOS transistor 343. In this embodiment, the switch 321 is comprised of an N-type MOS transistor. Therefore, the switch 321 becomes an on state (conducting state) when the second delay signal Sd2 whose signal level is at a high level is input to the control signal input terminal. On the other hand, when the second delay signal Sd2 whose signal level is at a low level is input to the control signal input terminal, the switch 321 becomes an off state (non-conducting state). Thus, when the MOS transistor 343 is in the on state and the gate voltage Vg applied to the gate terminal G of the IGBT 21 becomes larger than the comparison voltage Vcx, the switch 321 is switched from the off state (non-conducting state) to the on state (conducting state) after the delay time set by the second delay circuit 324 has elapsed. Consequently, a part of the current supplied from the MOS transistor 341b of the current mirror circuit 341 flows into the reference potential terminal Trp through the switch 321. As a result, the current amount of the gate current supplied from the current mirror circuit 341 to the gate terminal G of the IGBT 21 is reduced.

As illustrated in FIG. 7, the third current supply section 33 has the third delay circuit 332 which delays the input signal Sin controlling the IGBT 21. The third current supply section 33 has the switch 331 (an example of a third changeover switch) which switches between a disconnected state of the third current supply section 33 from the gate terminal G of the IGBT 21 and a connected state of the third current supply section 33 to the gate terminal G of the IGBT 21, based on the signal level of a third delay signal Sd3 output from the third delay circuit 332.

The switch 331 is comprised of an N-type MOS transistor, for example. One terminal (a drain terminal, for example) of the switch 331 is connected to the gate voltage output terminal Tg. Therefore, the one terminal of the switch 331 is connected to the gate terminal G of the IGBT 21 via the gate voltage output terminal Tg. Also, one terminal of the switch 331 is connected to a drain terminal of the MOS transistor 341b of the current mirror circuit 341. The other terminal (a source terminal, for example) of the switch 331 is connected to the reference potential terminal Trp. A control signal input terminal (the gate terminal, for example) of the switch 331 is connected to one terminal of the MOS transistor 344.

The input terminal of the third delay circuit 332 is connected to the output terminal (more specifically, the output terminal of the dead time circuit 352) of the delay circuit unit 35. The output terminal of the third delay circuit 332 is connected to the source terminal of the MOS transistor 344. Also, the output terminal of the third delay circuit 332 is connected to an input terminal of the first delay circuit 312. The third delay circuit 332 outputs to the MOS transistor 344, a third delay signal Sd3 obtained by delaying the delayed input signal Sin output from the delay circuit unit 35 further by a predetermined time. The third delay circuit 332 may have, for example, the same configuration as the second delay circuit 324 and may have a configuration different therefrom. The third delay circuit 332 generates as the third delay signal Sd3, the post-delay input signal Sin obtained by delaying the input signal Sin input from the delay circuit unit 35 by several tens of nanoseconds, for example.

When the MOS transistor 344 is in an on state (conducting state), the third delay signal Sd3 (i.e., the delayed input signal Sin) output from the third delay circuit 332 is input to the control signal input terminal of the switch 331 via the MOS transistor 344. In this embodiment, the switch 331 is comprised of an N-type MOS transistor. Therefore, the switch 331 becomes an on state (conducting state) when the third delay signal Sd3 whose signal level is at a high level is input to the control signal input terminal. On the other hand, when the third delay signal Sd3 whose signal level is at a low level is input to the control signal input terminal, the switch 331 becomes an off state (non-conducting state). The signal input to the gate terminal of the MOS transistor 344 is the input signal Sin delayed by the delay circuit unit 35. Therefore, after the lapse of the delay time in the third delay circuit 332 after the MOS transistor 344 is turned on, the third delay signal Sd3 output from the third delay circuit 332 through the MOS transistor 344 is input to the control signal input terminal of the switch 331. Consequently, since the switch 321 is switched from the off state (non-conducting state) to the on state (conducting state), a part of the current supplied from the MOS transistor 341b of the current mirror circuit 341 passes through the switch 331 to the reference potential terminal Trp. As a result, the current amount of the gate current supplied from the current mirror circuit 341 to the gate terminal G of the IGBT 21 decreases.

As illustrated in FIG. 7, the first current supply section 31 has the first delay circuit 312 which delays the third delay signal Sd3 with a time shorter than the delay time in the second delay circuit 324. The first current supply section 31 has the switch 311 (an example of a first changeover switch) which switches between a disconnected state of the first current supply section 31 from the gate terminal G of the IGBT 21 and a connected state of the first current supply section 31 to the gate terminal G of the IGBT 21, based on the signal level of the first delay signal Sd1 output from the first delay circuit 312.

The switch 311 is comprised of an N-type MOS transistor, for example. One terminal (a drain terminal, for example) of the switch 311 is connected to the gate voltage output terminal Tg. Therefore, the one terminal of the switch 311 is connected to the gate terminal G of the IGBT 21 via the gate voltage output terminal Tg. Also, the one terminal of the switch 311 is connected to the drain terminal of the MOS transistor 341b of the current mirror circuit 341. The other terminal (a source terminal, for example) of the switch 311 is connected to the reference potential terminal Trp. A control signal input terminal (a gate terminal, for example) of the switch 311 is connected to one terminal of the MOS transistor 342.

The input terminal of the first delay circuit 312 is connected to the output terminal of the third delay circuit 332. The output terminal of the first delay circuit 312 is connected to the source terminal of the MOS transistor 342. The first delay circuit 312 outputs to the MOS transistor 342, the first delay signal Sd1 obtained by delaying the third delay signal Sd3 (the delayed input signal Sin) output from the third delay circuit 332 further by a predetermined time. The first delay circuit 312 may have, for example, the same configuration as the second delay circuit 324 or the third delay circuit 332 and may have a configuration different therefrom. The first delay circuit 312 generates as the first delay signal Sd1, the post-delay input signal Sin obtained by delaying the third delay signal Sd3 input from the third delay circuit 332 by 350 ns, for example.

When the MOS transistor 342 is in an on state (conducting state), the first delay signal Sd1 (i.e., the delayed input signal Sin) output from the first delay circuit 312 is input to the control signal input terminal of the switch 311 via the MOS transistor 342. In this embodiment, the switch 311 is comprised of an N-type MOS transistor. Therefore, the switch 311 becomes an on state (conducting state) when the first delay signal Sd1 whose signal level is at a high level is input to the control signal input terminal. On the other hand, when the first delay signal Sd1 whose signal level is at a low level is input to the control signal input terminal, the switch 311 becomes an off state (non-conducting state). The signal input to the gate terminal of the MOS transistor 342 is the input signal Sin delayed by the delay circuit unit 35. Therefore, after the lapse of the delay time in the third delay circuit 332 and the first delay circuit 312 after the MOS transistor 342 is turned on, the first delay signal Sd1 output from the first delay circuit 312 through the MOS transistor 342 is input to the control signal input terminal of the switch 311. Consequently, since the switch 311 is switched from the off state (non-conducting state) to the on state (conducting state), a part of the current supplied from the MOS transistor 341b of the current mirror circuit 341 flows into the reference potential terminal Trp through the switch 311. As a result, the current amount of the gate current supplied from the current mirror circuit 341 to the gate terminal G of the IGBT 21 decreases.

(Operation of Drive Circuit of Switching Element)

The operation of the gate drive circuit 10D as the drive circuit of the switching element according to this embodiment will be described with reference to FIG. 7.

The gate drive circuit 10D according to this embodiment appropriately controls the switches 311, 321, and 331 from the start to the stop of the turn-on operation of the IGBT 21 in the same manner as the gate drive circuit 10A according to the first embodiment thereby to charge the gate capacitance of the IGBT 21 according to the three charging modes of the quick charging mode, the overshoot suppression mode, and the low current consumption mode.

In the gate drive circuit 10D, the signal level of the delayed input signal Sin input from the delay circuit unit 35 to the MOS transistor 144 provided in the gate signal generating section 34 is switched from the high level to low level, thereby starting the turn-on operation of the IGBT 21.

With the start of the turn-on operation of the IGBT 21, a gate current of a current amount for the quick charging mode (a current corresponding to the first current Ia and the third current Ic in the first embodiment) flows from the MOS transistor 341b of the current mirror circuit 341 provided in the gate signal generating section 34 to the gate terminal G of the IGBT 21.

With the gate current flowing to the gate terminal G of the IGBT 21, a parasitic capacitance Cge (that is, a gate capacitance) formed between the gate and emitter of the IGBT 21 is charged, and the gate voltage Vg applied to the gate terminal G rises.

As the gate voltage Vg applied to the gate terminal G of the IGBT 21 rises, the gate voltage Vg reaches the third voltage V3 set for switching from the quick charging mode to the overshoot suppression mode. In the gate drive circuit 10D, the delay time of the third delay circuit 332 is set to match the time from the time when the IGBT 21 starts the turn-on operation to the time when the gate voltage Vg applied to the gate terminal G of the IGBT 21 reaches the third voltage V3. A correlation between the delay time of the third delay circuit 332 and a voltage rising rate of the gate terminal G of the IGBT 21 is acquired by operation tests or operation simulations of the IGBT 21, etc., for example, and the delay time of the third delay circuit 332 is determined based on the acquired correlation.

Therefore, when the gate voltage Vg applied to the gate terminal G of the IGBT 21 reaches the third voltage V3, the switch 331 provided in the third current supply section 33 changes from the off state (non-conducting state) to the on state (conducting state), and the third current Ic which is a part of the current supplied from the MOS transistor 341b of the current mirror circuit 341 flows to the reference potential terminal Trp. Consequently, the third current Ic portion of the gate current flowing through the gate terminal G of the IGBT 21 in the quick charging mode is reduced. The third current Ic corresponds to, for example, 10% of the gate current in the quick charging mode.

Unlike the gate drive circuit 10A according to the first embodiment, the gate drive circuit 10D switches the third current supply section 33 from a state of being disconnected (cut off) from the gate terminal G of the IGBT 21 to a state of being connected to the gate terminal G by switching the switch 331 from the off state to the on state. Consequently, the gate drive circuit 10D switches the charging mode of the gate terminal G of the IGBT 21 from the quick charging mode to the overshoot suppression mode. Therefore, when the gate voltage Vg of the gate terminal G of the IGBT 21 is lower than the third voltage V3, the third current supply section 33 is brought into the state of being disconnected (cut off) from the gate terminal G, so that the third current Ic is supplied to the gate terminal G. On the other hand, when the gate voltage Vg of the gate terminal G of the IGBT 21 is higher than the third voltage V3, the third current supply section 33 is in the state of being connected to the gate terminal G, thereby making the third current Ic flow through the reference potential terminal Trp, whereby the third current Ic is prevented from being supplied to the gate terminal G.

The third voltage V3 is set based on the same technical basis as the third voltage V3 in the first embodiment. Therefore, when the gate voltage Vg applied to the gate terminal G of the IGBT 21 reaches the third voltage V3, the gate drive circuit 10D performs switching from the quick charging mode to the overshoot suppression mode, thereby making it possible to prevent a malfunction that the gate voltage Vg exceeds the second voltage V2 (the voltage for switching to the low current consumption mode) with an unexpected timing. Further, the gate drive circuit 10D can prevent a mirror period in the turn-on operation of the IGBT 21 from becoming longer, thereby making it possible to reduce a switching loss.

Even after switching to the overshoot suppression mode, the gate voltage Vg applied to the gate terminal G of the IGBT 21 continues to rise due to the gate current being supplied from the MOS transistor 341b of the current mirror circuit 341 to the gate terminal G of the IGBT 21. Thus, the gate voltage Vg applied to the gate terminal G of the IGBT 21 reaches the first voltage V1.

In the gate drive circuit 10D, the delay time of the first delay circuit 312 is set to match the time from the time when the gate voltage Vg applied to the gate terminal G of the IGBT 21 reaches the third voltage V3 to the time when it reaches the first voltage V1. A correlation between the delay time of the first delay circuit 312 and the voltage rise rate of the gate terminal G of the IGBT 21 is acquired by operation tests or operation simulations of the IGBT 21, etc., for example, and the delay time of the first delay circuit 312 is determined based on the acquired correlation.

Therefore, when the gate voltage Vg applied to the gate terminal G of the IGBT 21 reaches the first voltage V1, the switch 311 provided in the first current supply section 31 changes from the off state (non-conducting state) to the on state (conducting state), and the first current Ia, which is a part of the current supplied from the MOS transistor 341b of the current mirror circuit 341 flows to the reference potential terminal Trp. Consequently, the first current Ia portion of the gate current flowing through the gate terminal G of the IGBT 21 in the overshoot suppression mode is reduced. The first current Ia corresponds to, for example, 90% of the gate current in the overshoot suppression mode.

Unlike the gate drive circuit 10A according to the first embodiment, the gate drive circuit 10D switches the first current supply section 31 from a state of being disconnected (cut off) from the gate terminal G of the IGBT 21 to a state of being connected thereto by switching the switch 311 from the off state to the on state. Thus, the gate drive circuit 10D reduces the current amount of the gate current in the overshoot suppression mode in the charging mode of the gate terminal G of the IGBT 21. Therefore, when the gate voltage Vg of the gate terminal G of the IGBT 21 is lower than the first voltage V1, the first current supply section 31 is brought into the state of being disconnected (cut off) from the gate terminal G, whereby the first current Ia is supplied to the gate terminal G. On the other hand, when the gate voltage Vg of the gate terminal G of the IGBT 21 is higher than the first voltage V1, the first current supply section 31 is brought into the state of being connected to the gate terminal G, thereby making the first current Ia flow to the reference potential terminal Trp to prevent the supply of the first current Ia to the gate terminal G.

The first voltage V1 set to a voltage which is higher than the third voltage V3 and which is the same as the voltage based on the same technical basis as the second voltage V2 in the first embodiment or lower the voltage. With the gate voltage Vg applied to the gate terminal G of the IGBT 21 reaching the first voltage V1, the gate drive circuit 10D reduces the current value of the gate current from when the overshoot suppression mode is started, thereby making it possible to reduce current consumption in the turn-on operation of the IGBT 21.

Even after the first current supply section 31 is connected to the gate terminal G, the gate current is supplied to the gate terminal G of the IGBT 21 from the MOS transistor 341b of the current mirror circuit 341 in the overshoot suppression mode, so that the gate voltage Vg applied to the gate terminal G of the IGBT 21 continues to rise. Consequently, the gate voltage Vg applied to the gate terminal G of the IGBT 21 reaches the second voltage V2.

In the gate drive circuit 10D, the delay time of the second delay circuit 324 is set to match the time from the time when the turn-on operation of the IGBT 21 is started to the time when the gate voltage Vg reaches the second voltage V2. A correlation between the delay time of the second delay circuit 324 and the voltage rise rate of the gate terminal G of the IGBT 21 is acquired by operation tests or operation simulations of the IGBT 21, etc., for example, and the delay time of the second delay circuit 324 is determined based on the acquired correlation. In the gate drive circuit 10D, the delay time of the second delay circuit 324 is set to a time longer than each of the delay times of the first delay circuit 312 and the third delay circuit 332. Therefore, the comparison voltage Vcx generated by the voltage generating part 323 provided in the second current supply section 32 is set to a voltage lower than the third voltage V3, for example. Thus, the comparator 322 provided in the second current supply section 32 outputs an output signal whose signal level is at a high level to the second delay circuit 324 during execution of the quick charging mode. The second delay circuit 324 outputs to the switch 321, the second delay signal Sd2 obtained by delaying the output signal input from the comparator 322 at the timing when the gate voltage Vg applied to the gate terminal G of the IGBT 21 reaches the second voltage V2 set for switching from the overshoot suppression mode to the low current consumption mode.

Therefore, when the gate voltage Vg applied to the gate terminal G of the IGBT 21 reaches the second voltage V2, the switch 321 provided in the second current supply section 32 changes from the off state (non-conducting state) to the on state (conducting state), and a second current adjustment current Iba being a part of the current supplied from the MOS transistor 341b of the current mirror circuit 341 flows to the reference potential terminal Trp. The second current adjustment current Iba is a current having the amount of current obtained by subtracting the second current Ib in the first embodiment from the gate current in the overshoot suppression mode. Thus, the gate drive circuit 10D can supply the gate terminal G of the IGBT 21 with the same amount of gate current as the second current Ib in the first embodiment in the low current consumption mode. The second current adjustment current Iba corresponds to, for example, 95% of the gate current in the overshoot suppression mode after the gate voltage Vg becomes higher than the first voltage V1. That is, the second current Ib corresponds to, for example, 5% of the gate current in the overshoot suppression mode after the gate voltage Vg becomes higher than the first voltage V1.

Unlike the gate drive circuit 10A according to the first embodiment, the gate drive circuit 10D switches the second current supply section 32 from a state of being disconnected (cut off) from the gate terminal G of the IGBT 21 to a state of being connected thereto by switching the switch 321 from the off state to the on state. Thus, the gate drive circuit 10D switches the charging mode of the gate terminal G of the IGBT 21 from the overshoot suppression mode to the low current consumption mode. Therefore, when the gate voltage Vg of the gate terminal G of the IGBT 21 is lower than the second voltage V2, the second current supply section 32 is brought into the state of being disconnected (cut off) from the gate terminal G, whereby a current larger than the second current Ib is supplied to the gate terminal G. On the other hand, when the gate voltage Vg of the gate terminal G of the IGBT 21 is higher than the second voltage V2, the second current supply section 32 is brought into the state of being connected to the gate terminal G, thereby making the second current adjustment current Iba flow to the reference potential terminal Trp to thereby supply the second current Ib to the gate terminal G.

The second voltage V2 is set to a voltage based on the same technical basis as the second voltage V2 in the first embodiment. Therefore, the gate drive circuit 10D perform switching from the overshoot suppression mode to the low current consumption mode by the gate voltage Vg applied to the gate terminal G of the IGBT 21 reaching the second voltage V2, thereby making it possible to operate the IGBT 21 with low current consumption after the turn-on operation of the IGBT 21 is terminated.

Although not illustrated, the MOS transistors 144, 342, 343, and 344 are switched from an on state to an off state by the signal level of the input signal Sin being switched to a high level while the gate drive circuit 10D is charging the gate capacitance of the IGBT 21 in the low current consumption mode. Consequently, the current mirror circuit 341 stops operating, and hence the current supply from the MOS transistor 341b is stopped. Further, since the switches 311, 321 and 331 are also brought into an off state by turning off the MOS transistors 342, 343 and 344, the gate terminal G of the IGBT 21 becomes electrically floating. Therefore, the gate voltage Vg at the gate terminal G of the IGBT 21 is maintained at the voltage at the termination of the low current consumption mode (that is, the voltage at which the rated collector-emitter current of the IGBT 21 can be made to flow).

Thus, since the gate drive circuit 10D according to this embodiment can execute the overshoot suppression mode in the turn-on operation of the IGBT 21, it is possible to reduce the switching loss of the IGBT 21 in the same manner as the gate drive circuit 10A according to the first embodiment.

As described above, the gate drive circuit 10D according to this embodiment includes the first current supply section 31 which supplies the first current Ia to the gate terminal G provided in the IGBT 21 when the gate voltage Vg of the gate terminal G is lower than the first voltage V1, the second current supply section 32 which supplies the second current Ib smaller than the first current Ia to the gate terminal G when the gate voltage Vg of the gate terminal G is higher than the second voltage V2 which is the same as or higher than the first voltage V1, and the third current supply section 33 which supplies the third current Ic smaller than the first current Ia and larger than the second current Ib to the gate terminal G when the gate voltage Vg of the gate terminal G is lower than the third voltage V3 lower than the first voltage V1.

Thus, the gate drive circuit 10D according to this embodiment can prevent deterioration of the switching loss of the IGBT 21.

Further, the intelligent power module according to this embodiment includes a plurality of semiconductor devices (six in this embodiment) each having a semiconductor element 20 having an IGBT 21 and a freewheel diode 22 connected in antiparallel to the IGBT 21, and the gate drive circuit 10D according to this embodiment.

Thus, the intelligent power module according to this embodiment can prevent deterioration of the switching loss of the IGBT 21 as with the gate drive circuit 10D.

Fifth Embodiment

A drive circuit of a switching element and an intelligent power module according to a fifth embodiment of the present invention will be described with reference to FIG. 8. The intelligent power module according to this embodiment has the same configuration as and develops the same function as the intelligent power module 2 according to the first embodiment, except that the configuration of the drive circuit of the switching element is different, and the description thereof will therefore be omitted.

[Configuration of Drive Circuit of Switching Element]

The drive circuit of the switching element according to this embodiment is characterized in that a detected current detected at a current detection terminal is used as a voltage based on a voltage of a control signal input terminal. Components having the same operations and functions as the components of the gate drive circuit 10D according to the fourth embodiment are denoted by the same reference numerals, and the description thereof will be omitted. FIG. 8 is a circuit diagram illustrating an example of a schematic configuration of a gate drive circuit 10E as a switching element according to this embodiment.

Figure 8:
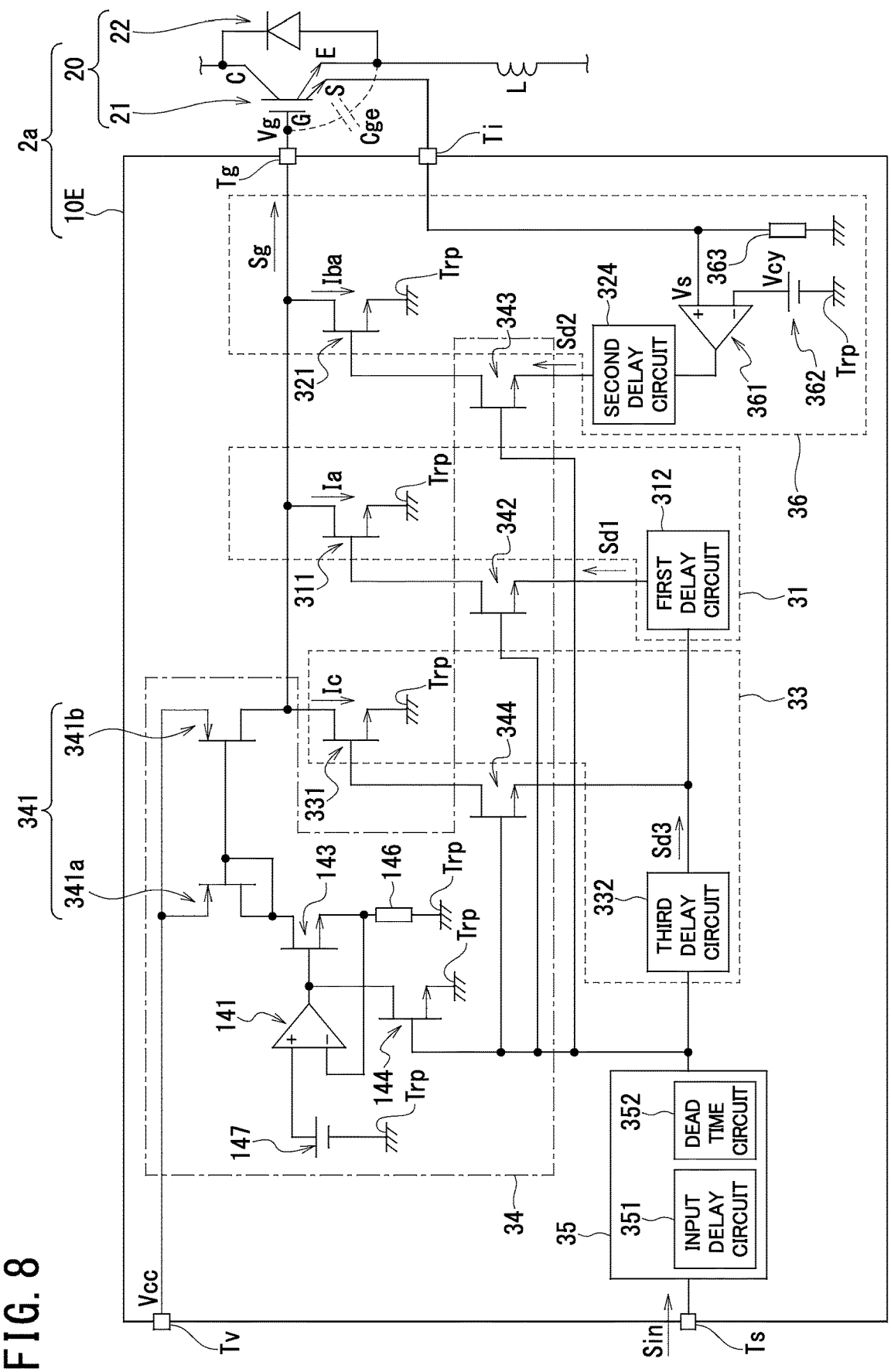
FIG. 8 is a circuit diagram illustrating an example of a schematic configuration of a gate drive circuit as a drive circuit of a switching element according to a fifth embodiment of the present invention.

As illustrated in FIG. 8, the gate drive circuit 10E includes a gate signal generating section 34 which generates a gate signal (an example of a control signal) Sg to control an IGBT 21 by using an input signal Sin input from a control device 6 (refer to FIG. 1). Also, the gate drive circuit 10E includes a first current supply section 31 which supplies a first current Ia to a gate terminal G (an example of the control signal input terminal) provided in an IGBT (an example of the switching element) 21 when a gate voltage (an example of the voltage) Vg of the gate terminal G is lower than a first voltage V1. Further, the gate drive circuit 10E includes a second current supply section 36 which supplies a second current Ib smaller than the first current Ia to the gate terminal G when the gate voltage Vg of the gate terminal G is higher than a second voltage V2 which is the same as or higher than the first voltage V1. In this embodiment, the second voltage V2 is set to a voltage higher than the first voltage V1. In addition, the gate drive circuit 10E includes a third current supply section 33 which supplies a third current Ic smaller than the first current Ia and larger than the second current Ib to the gate terminal G when the gate voltage Vg of the gate terminal G of the IGBT 21 is lower than a third voltage V3 lower than the first voltage V1. The first voltage V1, the second voltage V2, the third voltage V3, the first current Ia, the second current Ib, and the third current Ic in this embodiment are set as with the first voltage V1, the second voltage V2, the third voltage V3, the first current Ia, the second current Ib, and the third current Ic in the fourth embodiment.

As illustrated in FIG. 8, the second current supply section 36 has a comparator 361 (an example of a second comparison part) which compares the gate voltage (an example of a voltage based on the voltage of the control signal input terminal) Vg and a comparison voltage Vcy. The second current supply section 36 has a second delay circuit 324 which delays an output signal output from the comparator 361. The second current supply section 36 has a switch 321 (an example of a second changeover switch) which switches between a disconnected state of the second current supply section 36 from the gate terminal G of the IGBT 21 and a connected state of the second current supply section 36 to the gate terminal G of the IGBT 21, based on the signal level of a second delay signal Sd2 output from the second delay circuit 324.

Further, the second current supply section 36 has a resistance element 363 connected between a current detection terminal S of the IGBT 21 and a reference potential terminal Trp, and a voltage generating part 362 which generates the comparison voltage Vcy. Specifically, one terminal of the resistance element 363 is connected to a detection current input terminal Ti. Thus, the resistance element 363 is connected to the current detection terminal S via the detection current input terminal Ti. The other terminal of the resistance element 363 is connected to the reference potential terminal Trp. The second current supply section 36 is configured to output, as a detected voltage Vs, a voltage drop occurring in the resistance element 363 by the detected current output from the current detection terminal S flowing through the resistance element 363. That is, the second current supply section 36 outputs a voltage at one terminal of the resistance element 363 connected to the current detection terminal S as the detected voltage Vs.

The voltage generating part 362 is configured by a DC power supply, for example. A negative side of the voltage generating part 362 is connected to the reference potential terminal Trp. The voltage generating part 362 is adapted to generate the comparison voltage Vcy. The comparison voltage Vcy in this embodiment is set to the same voltage as the voltage drop occurring in the resistance element 363 by the detected current flowing through the current detection terminal S flowing through the resistance element 363 when the comparison voltage Vcx in the fourth embodiment is applied to the gate terminal G of the IGBT 21. The detected current flowing through the current detection terminal S when the comparison voltage Vcy is applied to the gate terminal G of the IGBT 21 is obtained by operation tests and operation simulations of the IGBT 21, for example.

The comparator 361 is, for example, a hysteresis comparator comprised of an operational amplifier and an unillustrated resistance element. A non-inversion input terminal (+) of the comparator 361 is connected to a connecting portion of one terminal of the resistance element 363 and the reference potential terminal Trp. A positive side of the voltage generating part 362 is connected to an inversion input terminal (−) of the comparator 361. An output terminal of the comparator 361 is connected to an input terminal of the second delay circuit 324.

When the detected voltage Vs (i.e., voltage corresponding to the gate voltage Vg of the gate terminal G of the IGBT 21) based on the detected current flowing through the current detection terminal S is lower than the comparison voltage Vcy generated in the voltage generating part 362, the comparator 361 outputs an output signal whose signal level (i.e., voltage level) is at a low level. Further, the comparator 361 outputs an output signal whose signal level is at a high level when the detected voltage Vs based on the detected current is higher than the comparison voltage Vcy.

Thus, the operation of the comparator 361 in this embodiment with respect to the level of the detected voltage Vs (that is, the gate voltage Vg) and the comparison voltage Vcy, and the operation of the comparator 322 in the fourth embodiment with respect to the level of the gate voltage Vg and the comparison voltage Vcx are the same. Further, the second delay circuit 324 to which the output terminal of the comparator 361 is connected, and the switch 321 to which the output terminal of the second delay circuit 324 is connected have the same configurations as the second delay circuit 324 and the switch 321 in the fourth embodiment. Therefore, the second current supply section 36 can operate in the same manner as the second current supply section 32 in the fourth embodiment and exhibit the same function.

[Operation of Drive Circuit of Switching Element]

The gate drive circuit 10E as the drive circuit of the switching element according to this embodiment is the same as the gate drive circuit 10D according to the fourth embodiment except that the detected current flowing through the current detection terminal S in the second current supply section 36 is used to switch from the overshoot suppression mode to the quick charging mode, and the description thereof will therefore be omitted.

As described above, the gate drive circuit 10E according to this embodiment includes the first current supply section 31 which supplies the first current Ia to the gate terminal G when the gate voltage Vg of the gate terminal G provided in the IGBT 21 is lower than the first voltage V1, the second current supply section 36 which supplies the second current Ib smaller than the first current Ia to the gate terminal G when the gate voltage Vg of the gate terminal G is higher than the second voltage V2 which is the same as or higher than the first voltage V1, and the third current supply section 33 which supplies the third current Ic smaller than the first current Ia and larger than the second current Ib to the gate terminal G when the gate voltage Vg of the gate terminal G is lower than the third voltage V3 lower than the first voltage V1.

Thus, the gate drive circuit 10E according to this embodiment can prevent deterioration of a switching loss of the IGBT 21.

Further, the intelligent power module according to this embodiment includes a plurality of semiconductor devices (six in this embodiment) each having a semiconductor element 20 (refer to FIG. 8) having an IGBT 21 and a freewheel diode 22 connected in antiparallel to the IGBT 21, and the gate drive circuit 10E according to this embodiment.

Thus, the intelligent power module according to this embodiment can prevent deterioration of the switching loss of the IGBT 21 in a manner similar to the gate drive circuit 10E.

The present invention is not limited to the above embodiments, and various modifications are possible.

In the first to third embodiments, the first voltage V1 is set to the voltage having the same voltage value as the second voltage V2, but the present invention is not limited to this. For example, the first current supply section is not switched between the connected state and the disconnected state with respect to the gate terminal of the IGBT on the basis of the output signal output from the buffer circuit of the second current supply section, but may be switched between the states with respect to the gate terminal of the IGBT 21, based on the output signal output from the comparator as in the second current supply section. In this case, the comparator may be configured to compare the gate voltage of the IGBT with the voltage lower than the second voltage. Thus, the second current supply section can supply the second current smaller than the first current to the gate terminal when the gate voltage is higher than the second voltage higher than the first voltage.

Although the semiconductor devices 2a to 2f according to the above embodiments include the IGBTs 21 as the switching elements, the present invention is not limited to this. The switching element provided in the semiconductor device may be either an IGBT, a bipolar transistor, or a MOS transistor. Also, the switching element may be a wide bandgap semiconductor element including SiC, GaN, diamond, a gallium nitride-based material, a gallium oxide-based material, AlN, AlGaN or ZnO, or the like.

The technical scope of the present invention is not limited to the illustrated and described exemplary embodiments, but includes all embodiments which bring about effects equivalent to those intended by the present invention. Further, the technical scope of the present invention is not limited to the combination of inventive features defined by the claims, but can be defined by any desired combination of the particular features of each and every disclosed feature.

REFERENCE SIGNS LIST 1 power conversion apparatus
2 intelligent power module
2a, 2b, 2c, 2d, 2e, 2f semiconductor device
2U U-phase output arm
2V V-phase output arm
2W W-phase output arm
3 three-phase AC power supply
4 rectifier circuit
5 smoothing capacitor
6 control device
7 motor
10A, 10B, 10C, 10D, 10E gate drive circuit
11, 31 first current supply section
12, 32, 36 second current supply section
13, 15, 16, 33 third current supply section
14, 34 gate signal generating section
20 semiconductor element
21 IGBT
22 freewheel diode
35 delay circuit unit
111, 121, 131, 142a, 143, 144, 145, 341a, 341b, 342, 343, 344 MOS transistor
112, 124, 133, 311, 321, 331 switch
122, 126, 132, 151, 322, 361 comparator
123, 134 logic circuit unit
123a Buffer circuit
123b XNOR circuit
125, 127, 135, 147, 152, 323, 362 voltage generating unit
130, 150 current supply unit
134a AND circuit
141 amplifier
142, 341 current mirror circuit
146, 153, 363 resistance element
312 first delay circuit
324 second delay circuit
332 third delay circuit
351 input delay circuit
352 Dead time circuit
C Collector terminal
Cge Parasitic Capacitance
E Emitter terminal
G Gate terminal
Ia First current
Ib Second current
Iba second current adjustment current
Ic, Ic-1, Ic-2 third current
Ice, IceC collector-emitter current
Ir rated current
L parasitic inductance
Ln negative side line
Lp positive side line
LU loss improvement
Pd1, Pd2, Pm3 period
Pmc, Pme mirror period
S current detection terminal
Sd1 first delay signal
Sd2 second delay signal
Sd3 third delay signal
Sg gate signal
Sin input signal
Tg gate voltage output terminal
Ti detection current input terminal
Trp reference potential terminal
Ts signal input terminal
Tv power supply input terminal
V1 first voltage
V2 second voltage
V3, V3-1, V3-2 third voltage
Vc, Vcx, Vcy comparison voltage
Vcc power supply voltage
Vce, VceC collector-emitter voltage
Vg, VgC gate voltage
Vr rated voltage
Vs detected voltage

The invention claimed is:

1. A drive circuit of a switching element, comprising:
a first current supply section which supplies a first current to a control signal input terminal provided in the switching element when a voltage of the control signal input terminal is lower than a first voltage;
a second current supply section which supplies a second current smaller than the first current to the control signal input terminal when the voltage of the control signal input terminal is higher than a second voltage which is the same as or higher than the first voltage; and
a third current supply section which supplies a third current smaller than the first current and larger than the second current to the control signal input terminal when the voltage of the control signal input terminal is lower than a third voltage lower than the first voltage.

2. The drive circuit of the switching element according to claim 1, wherein the second current supply section has a second comparison part which compares a voltage based on the voltage of the control signal input terminal and the second voltage, and
a second changeover switch which switches between a disconnected state of the second current supply section from the control signal input terminal and a connected state of the second current supply section to the control signal input terminal, based on a signal level of an output signal output from the second comparison part.

3. The drive circuit of the switching element according to claim 2, wherein the third current supply section has a third comparison part which compares the voltage based on the voltage of the control signal input terminal and the third voltage, and
a third changeover switch which switches between a disconnected state of the third current supply section from the control signal input terminal and a connected state of the third current supply section to the control signal input terminal, based on the signal level of the output signal output from the second comparison part and a signal level of an output signal output from the third comparison part.

4. The drive circuit of the switching element according to claim 3, wherein the first current supply section has a first changeover switch which switches between a disconnected state of the first current supply section from the control signal input terminal and a connected state of the first current supply section to the control signal input terminal, based on the signal level of the output signal output from the second comparison part.

5. An intelligent power module comprising:
a plurality of semiconductor devices each including:
a semiconductor element having a switching element and a diode connected in antiparallel to the switching element, and
a drive circuit of a switching element according to claim 4.

6. An intelligent power module comprising:
a plurality of semiconductor devices each including:
- a semiconductor element having a switching element and a diode connected in antiparallel to the switching element, and
- a drive circuit of a switching element according to claim 3.

7. The drive circuit of the switching element according to claim 2, wherein the first current supply section has a first changeover switch which switches between a disconnected state of the first current supply section from the control signal input terminal and a connected state of the first current supply section to the control signal input terminal, based on the signal level of the output signal output from the second comparison part.

8. An intelligent power module comprising:
a plurality of semiconductor devices each including:
- a semiconductor element having a switching element and a diode connected in antiparallel to the switching element, and
- a drive circuit of a switching element according to claim 7.

9. An intelligent power module comprising:
a plurality of semiconductor devices each including:
- a semiconductor element having a switching element and a diode connected in antiparallel to the switching element, and
- a drive circuit of a switching element according to claim 2.

10. The drive circuit of the switching element according to claim 1, wherein the second current supply section has a second comparison part which compares the voltage based on the voltage of the control signal input terminal and a comparison voltage,
- a second delay circuit which delays the output signal output from the second comparison part, and
- a second changeover switch which switches between a disconnected state of the second current supply section from the control signal input terminal and a connected state of the second current supply section to the control signal input terminal, based on a signal level of a second delay signal output from the second delay circuit.

11. The drive circuit of the switching element according to claim 10, wherein the third current supply section has a third delay circuit which delays a control signal to control the switching element, and

- a third changeover switch which switches between a disconnected state of the third current supply section from the control signal input terminal and a connected state of the third current supply section to the control signal input terminal, based on a signal level of a third delay signal output from the third delay circuit.

12. The drive circuit of the switching element according to claim 11, wherein the first current supply section has a first delay circuit which delays the third delay signal in a shorter time than a delay time in the second delay circuit, and
- a first changeover switch which switches between a disconnected state of the first current supply section from the control signal input terminal and a connected state of the first current supply section to the control signal input terminal, based on a signal level of a first delay signal output from the first delay circuit.

13. An intelligent power module comprising:
a plurality of semiconductor devices each including:
- a semiconductor element having a switching element and a diode connected in antiparallel to the switching element, and
- a drive circuit of a switching element according to claim 12.

14. An intelligent power module comprising:
a plurality of semiconductor devices each including:
- a semiconductor element having a switching element and a diode connected in antiparallel to the switching element, and
- a drive circuit of a switching element according to claim 11.

15. An intelligent power module comprising:
a plurality of semiconductor devices each including:
- a semiconductor element having a switching element and a diode connected in antiparallel to the switching element, and
- a drive circuit of a switching element according to claim 10.

16. An intelligent power module comprising:
a plurality of semiconductor devices each including:
- a semiconductor element having a switching element and a diode connected in antiparallel to the switching element, and
- a drive circuit of a switching element according to claim 1.

* * * * *